United States Patent
Hébert et al.

(10) Patent No.: US 8,461,004 B2
(45) Date of Patent: *Jun. 11, 2013

(54) CONFIGURATION OF HIGH-VOLTAGE SEMICONDUCTOR POWER DEVICE TO ACHIEVE THREE DIMENSIONAL CHARGE COUPLING

(75) Inventors: François Hébert, San Mateo, CA (US); Tao Feng, Santa Clara, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/066,373

(22) Filed: Apr. 12, 2011

(65) Prior Publication Data

US 2011/0201174 A1     Aug. 18, 2011

Related U.S. Application Data

(62) Division of application No. 12/660,358, filed on Feb. 24, 2010, now Pat. No. 7,977,740, which is a division of application No. 11/656,104, filed on Jan. 22, 2007, now Pat. No. 7,670,908.

(51) Int. Cl.
*H01L 21/336*     (2006.01)

(52) U.S. Cl.
USPC ..... 438/270; 438/259; 257/E29.13; 257/E29.201

(58) Field of Classification Search
USPC ............. 438/259, 270, 271; 257/E21.585, 257/E21.586, E21.621, E21.624
See application file for complete search history.

(56) References Cited

U.S. PATENT DOCUMENTS 6,184,555 B1 * 2/2001 Tihanyi et al. ............... 257/342
7,670,908 B2 * 3/2010 Hebert et al. ................ 438/259

* cited by examiner

*Primary Examiner* — Eduardo A Rodela
(74) *Attorney, Agent, or Firm* — Bo-In Lin

(57) ABSTRACT

This invention discloses semiconductor device that includes a top region and a bottom region with an intermediate region disposed between said top region and said bottom region with a controllable current path traversing through the intermediate region. The semiconductor device further includes a trench with padded with insulation layer on sidewalls extended from the top region through the intermediate region toward the bottom region wherein the trench includes randomly and substantially uniformly distributed nano-nodules as charge-islands in contact with a drain region below the trench for electrically coupling with the intermediate region for continuously and uniformly distributing a voltage drop through the current path.

3 Claims, 33 Drawing Sheets

Rsp versus BV

CONFIGURATION OF HIGH-VOLTAGE SEMICONDUCTOR POWER DEVICE TO ACHIEVE THREE DIMENSIONAL CHARGE COUPLING

This patent application is a Divisional Application of a application Ser. No. 12/660,358 filed on Feb. 24, 2010 now U.S. Pat. No. 7,977,740, and application Ser. No. 12/660,358 is a Divisional Application of application Ser. No. 11/656,104 filed on Jan. 22, 2007 now issued into U.S. Pat. No. 7,670,908. The Disclosures made in the patent application Ser. Nos. 12/660,358 and 11/656,104 are hereby incorporated by reference.

BACKGROUND OF THE INVENTION

1. Field of the Invention

The invention relates generally to the semiconductor devices. More particularly, this invention relates to a semiconductor device with high breakdown voltage and low on-resistance implemented with a three-dimensional charge balancing configuration for uniformly distributing crystals as uniformly distributed charge coupling elements distributed over the trenches that extend into the drift drain region of the high-voltage device such as cathode of diode, drain of MOSFET, Collector of Bipolar, etc.

2. Description of the Prior Art

Conventional technologies of designing and manufacturing semiconductor devices in striving to achieve a high breakdown voltage as well as low on resistance are still confronted with challenges and limitations. Specifically, breakdown in a high voltage device is often caused by concentration of electric fields. The concentration of the electric fields frequently occurs in the edges or corners of an electric device or at particular junction points. For the purpose of increasing the breakdown voltage, devices of larger form factors or implementation of materials with higher resistivity may be used. However, such devices, even with increased breakdown voltages, lead to another unfavorable performance parameter of a higher on-resistance. These two competitive and inherent conflicting design considerations to those of ordinary skill in the art become a technical difficulty that cannot be conveniently resolved. As will be briefly reviewed below, many device configurations and manufacturing methods have been disclosed in attempt to resolve the problems caused by this technical difficulty.

Designs and manufacturing methods have been disclosed to achieve a high breakdown voltage in three basic types of device structures. The first type of structure is implemented with a typical vertical DMOS structure wherein a high breakdown voltage is achieved by maintaining a low dopant concentration of the drain drift region as that shown in FIG. 1A. In this vertical DMOS device, the N-epitaxial region that constitutes a N-drift region is kept at a relatively low dopant concentration. FIG. 1B is a "Johnson Limit" diagram to illustrate the "figure of merit" of this device by showing the resistance Rsp as a function of breakdown voltage BV. As illustrated in FIG. 1B, there is no enhancement in the breakdown voltage beyond the 1D (one-dimensional) theoretical figure of merit shown in the Johnson Limit diagram due to the fact that there is no charge balance of the field shaping. Even though such device structure generally has lower manufacturing costs because of simpler configuration and processes, the devices of this type of structure have large die size as that required to achieve both the high BV and low on-resistance. This type of device structures is therefore not suitable for modern electronic devices that frequently require miniaturized size in order to satisfy the convenient portability requirements.

The second type of device structure is a two-dimensional charge balance structure. This type of structures has an advantage over the first type of structure because the breakdown voltage enhancement is achieved beyond the estimated Johnson limit criteria. One of the embodiments for such structure is through a super-junction configuration to achieve a reduced Rsp by increasing the drain doping while maintaining the desired breakdown voltage. FIG. 2A shows device where P-type vertical columns are formed in the drain thus resulting in lateral and complete depletion of the drain at a high voltage. Meanwhile the P-columns serve the function to pinch off and shield the channel from the high voltage at the drain terminal disposed on the bottom of the N+ substrate. FIG. 2B is a diagram that shows the improved performance achieved because of the charge balance effect. FIG. 2C shows a floating island configuration implemented to increase the breakdown voltage and lower the resistance by increasing the dopant concentration of a given breakdown voltage. FIG. 2D shows the further improvement achieved by this device. The super junction configuration as shown relies on the depletion of the P-regions to shield the gate/channel from the drain at a high voltage. FIGS. 2E-1 and 2E-2 show another device configuration implemented with oxide bypass to achieve BV enhancement and resistance reduction. The oxide bypass is formed as a vertical field plate inside the drain instead of the P-regions. However, the field plate has the drawback that the entire drain to source voltage is across the oxide that separates the field plate from the semiconductor thus requiring thicker oxide layers. FIG. 2F is a diagram show the figure of merit improvement. FIG. 2G shows another device configuration with enhanced performance of higher breakdown voltage implemented with deep trenches filled with semi-insulating polysilicon (SiPOS) as that disclosed by Boden in U.S. Pat. No. 6,452,230 and Kinzer in U.S. Pat. No. 6,608,350. However, such SiPOS devices have a drawback due to the slow transient performance caused by the extremely high series resistance in the trench under high frequency switch operations.

This type of structures can only achieve limited performance enhancement due to the lack of lateral charge balance and lack of the drain bias coupling. The devices of this type of structures are also high sensitive to manufacturing variations thus may become unreliable unless the manufacturing processes are well controlled.

The third type of device structures to increase the breakdown voltage is achieved through three-dimensional (3D) charge coupling. FIGS. 3A-1 and 3A-2 show such device structure with biased SiPOS filled trenches used to function as a voltage divider between the drain at a high voltage and the low voltage gate/source region near the top surface. The SiPOS trench filling material is a semiconductor with a high resistance achieved by incorporating oxygen into the silicon. Therefore, the SiPOS is functioning as the resistive elements and not as a charge-storage or a capacitive element. FIGS. 3B-1 and 3B-2 show the functional principles of the structure where the SiPOS constitutes as a resistive connection between the high bias drain and a low bias source. The electric field in the resistors is coupled laterally through capacitive coupling to the adjacent drift region thus resulting in the depletion in the adjacent regions. FIGS. 3C-1 and 3C-2 show another device configuration with stacked and coupled diode (SCD). The PN junction diodes are formed in the trenches as stacked and coupled diodes to enhance the breakdown voltage (U.S. Pat. No. 7,132,712). Such device however has a limitation due to the use of SiPOS that is not available in many foundries or commercial fabrication facilities thus causing inconveniences and also increase the fabrication costs. Furthermore, the disclosures as described above still cannot achieve full three-dimensional charge balance due to the "discrete coupling" as that inherent in these device structures. Furthermore, significant increase of manufacturing cost is required in order to achieve higher number of coupling elements for performance enhancement.

In another Patent Application US20060255401, in order to increase the breakdown voltage with reduced resistance, a device is implemented with insulating trenches that includes a series of capacitive structures extending over an intermediate region between a top surface and a bottom surface of the device. The capacitive structure in the trenches is formed with floating elements composed of particularly selected materials to function as charge coupling in order to achieve charge balance along all directions thus providing a device with a high breakdown voltage and low resistance. However, complicate processes with multiple steps of floating element formation are required to form these floating elements in the trenches thus causing unfavorable impacts to the production cost.

Therefore, a need still exists in the art of semiconductor device design and manufacture to provide new device configurations and manufacturing method in forming the vertical semiconductor devices such that the above discussed problems and limitations can be resolved.

SUMMARY OF THE PRESENT INVENTION

It is therefore an aspect of the present invention to provide a new and improved high voltage semiconductor device with high breakdown voltage and reduced series resistance that can be more economically manufactured with simplified fabrication processes to provide reliable devices such that the above-discussed limitations and difficulties can be resolved.

It is another aspect of the present invention that new and simplified manufacturing processes are disclosed to provide devices with high breakdown voltage and reduced series resistance that can be conveniently and compatibly manufactured by foundries with standard foundry equipment.

It is another aspect of the present invention that new and improved device structures with trenches filled with nano crystals to function as charge islands substantially distributed uniformly such that improved three-dimensional charge balance is achieved to achieve improved high breakdown voltage and further reduced series resistance.

It is another aspect of the present invention that new and improved device structures with trenches filled with nano crystals to function as charge islands substantially distributed uniformly wherein the nano crystals are insulated to provide capacitive coupling such that improved leakage-proof is achieved.

It is another aspect of the present invention that new and simplified manufacturing processes are disclosed to provide device structures that can be conveniently and compatibly implemented with different transistors such as MOSFETs, BJTs, JFETs, SiTs, IGBTs, etc. and also different kinds of bipolar devices, and diodes such as Schottky, avalanche, etc.

It is another aspect of the present invention that new and simplified manufacturing processes are disclosed to provide device structures with improved breakdown voltages and reduced series resistance that the device configuration and manufacturing processes can be conveniently scalable from low to high voltages.

It is another aspect of the present invention that new and simplified manufacturing processes are disclosed that can be implemented with a single trench filling process and can be compatible with different trench filling materials including conductors and semiconductors formed as nano crystals, grains, or nodules formed in a dielectric matrix to provide device structures with improved breakdown voltages and reduced series resistance.

It is another aspect of the present invention that new and improved device structures with trenches filled with nano crystals composed of dielectric as insulator for minimizing leakage with embedded distributed storage capabilities such that 3D charge balance is achieved with reduced leakage without increasing the series resistance.

Briefly in a preferred embodiment this invention discloses a semiconductor device that includes a top region and a bottom region with an intermediate region disposed between the top region and the bottom region. The semiconductor device further includes a controllable current path traversing through the intermediate region. The semiconductor device further includes an insulating trench extended from the top region through the intermediate region toward the bottom region wherein the insulating trench comprising randomly and substantially uniformly distributed charge-islands for electrically coupling with the intermediate region for continuously and uniformly distributing a voltage drop through the current path. In an exemplary embodiment, the charge-islands coupling electrically with the intermediate region for distributing a voltage with a linearly graded drop along a depth of the insulating trench.

Furthermore, this invention discloses a method for manufacturing a semiconductor device includes a step of opening a trench in a substrate and forming nano charge islands for storing charge thereon thus achieving charge balance through capacitive coupling for enhancing a breakdown voltage of the semiconductor device. In a preferred embodiment, the step of forming the nano charge-islands further includes a step of depositing a dielectric material into the trench followed by annealing and forming nano-crystals of the dielectric material constituting the nano charge islands.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 3A-1 and 3A-2 are cross sectional views of a third type structure of a high voltage device with SiPOS filled trench to function as three-dimensional charge balance device.

FIGS. 3B-1 and 3B-2 are equivalent circuit diagrams of FIGS. 3A-1 and 3A-2.

FIGS. 3C-1 and 3C-2 are cross sectional view and an equivalent circuit respectively of a stacked-coupled-diode (SCD-diode) device.

FIG. 4A, 4A-1, and 4A-2 are cross sectional views of a device according to the present invention.

DETAILED DESCRIPTION OF THE METHOD

Figure 2A:
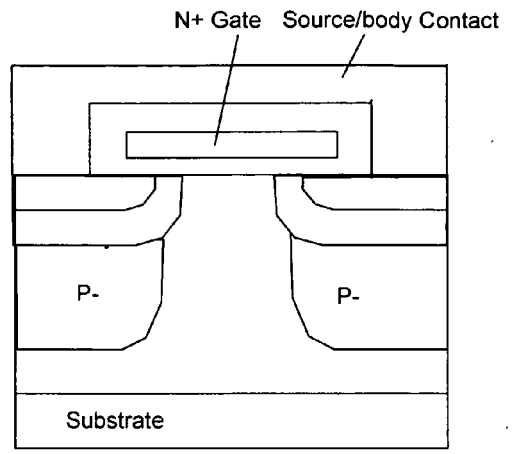
FIGS. 2A and 2B are cross sectional view and performance diagram illustrated as Rsp versus breakdown voltage respectively for illustrating the configuration and performance of a second type of conventional high voltage vertical devices implemented with doped-columns, such as the P-columns.
Figure 2B:
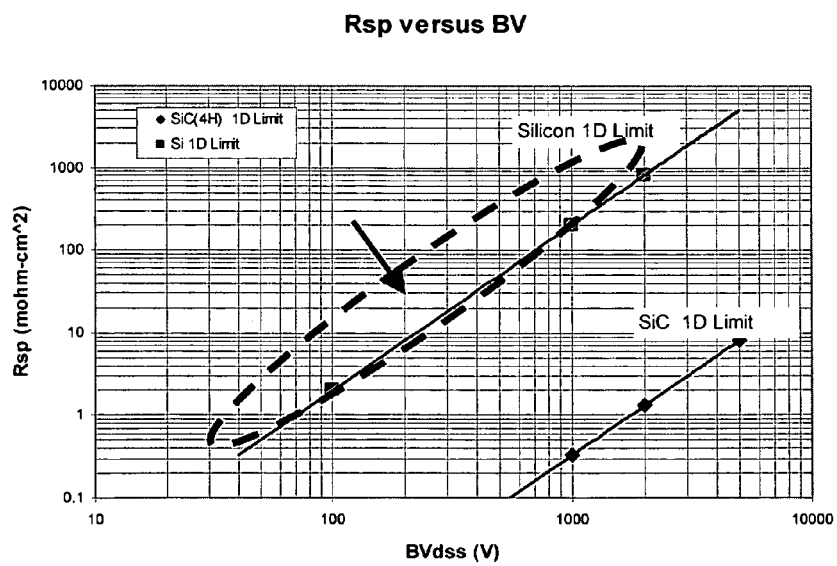
Figure 2C:
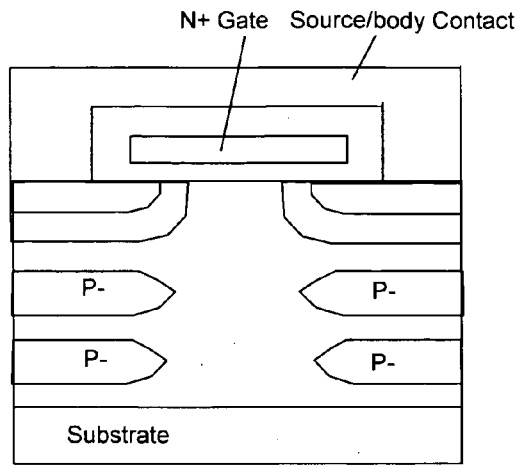
FIGS. 2C and 2D are cross sectional view and performance diagram illustrated as Rsp versus breakdown voltage respectively for illustrating the configuration and performance of a second type of conventional high voltage vertical devices implemented with doped-islands, such as the P-islands.
Figure 2D:
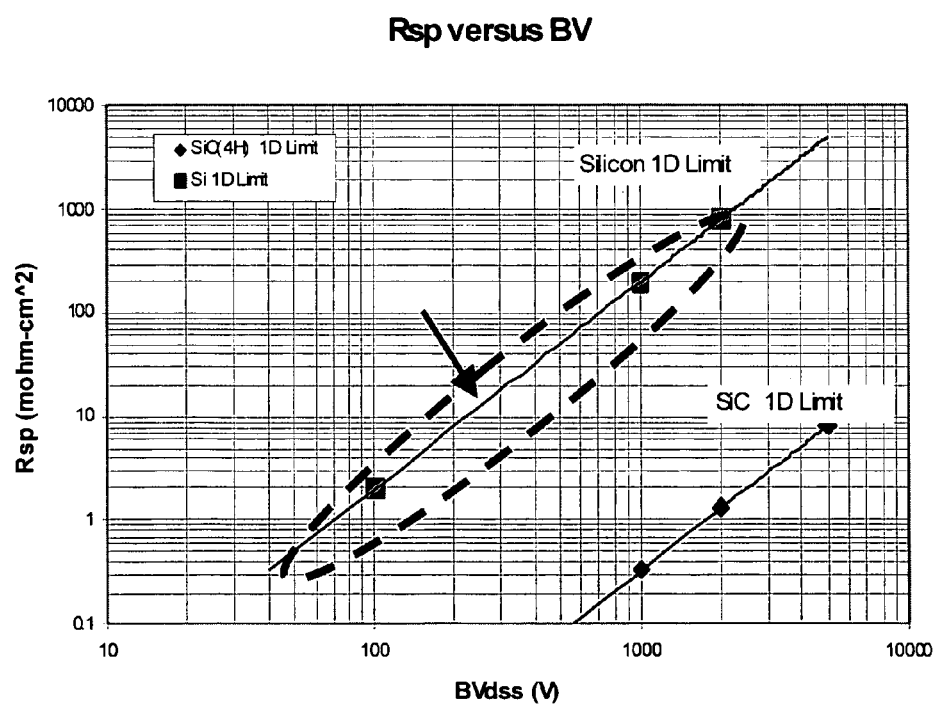
Figures 1, 2E:
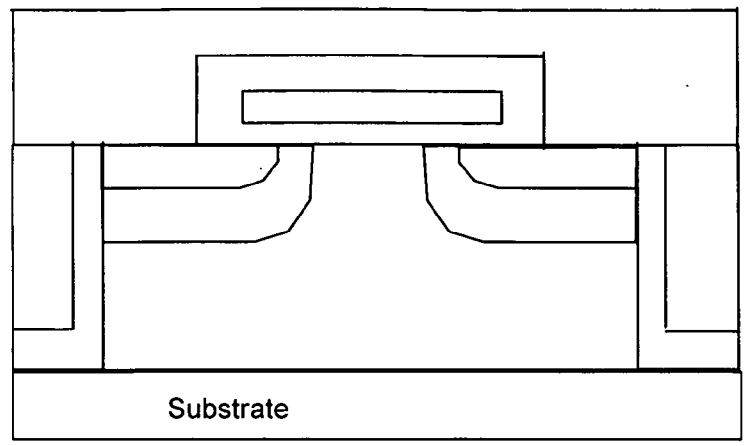
FIGS. 2E-1, 2E-2, and 2F are cross sectional view and performance diagram illustrated as Rsp versus breakdown voltage respectively for illustrating the configuration and performance of a second type of conventional high voltage vertical devices implemented with oxide-bypass field plate.
Figures 2, 2E:
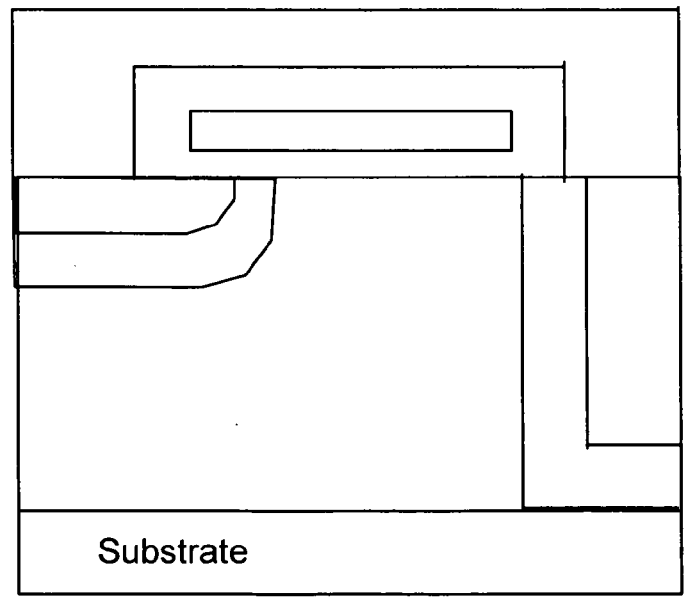
Figure 2F:
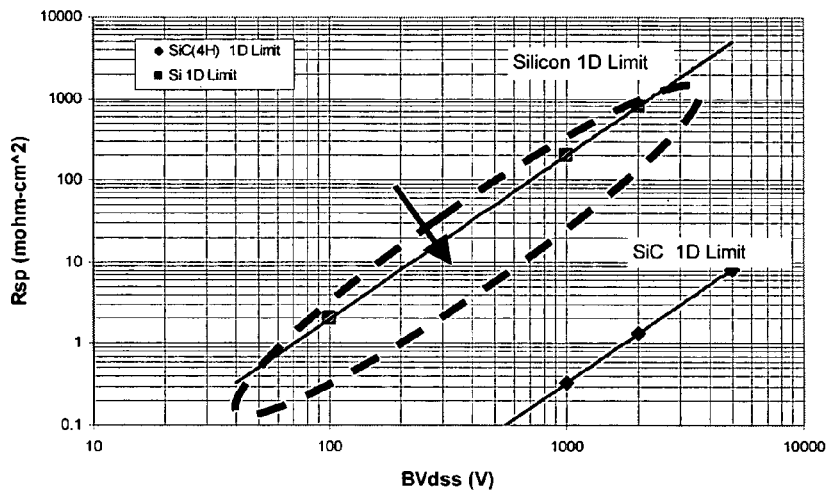
Figure 2G:
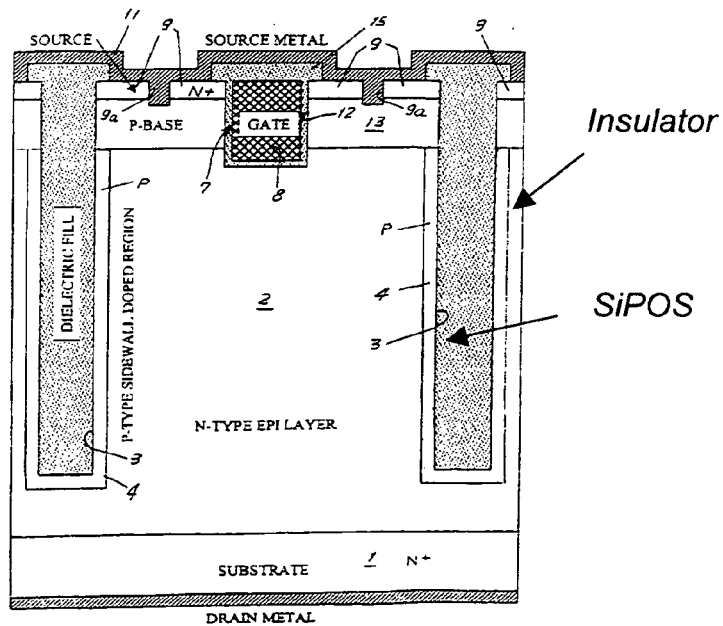
FIG. 2G is cross sectional view of a second type of conventional high voltage vertical devices implemented with SiPOS filled trench device.
Figures 1, 3A:
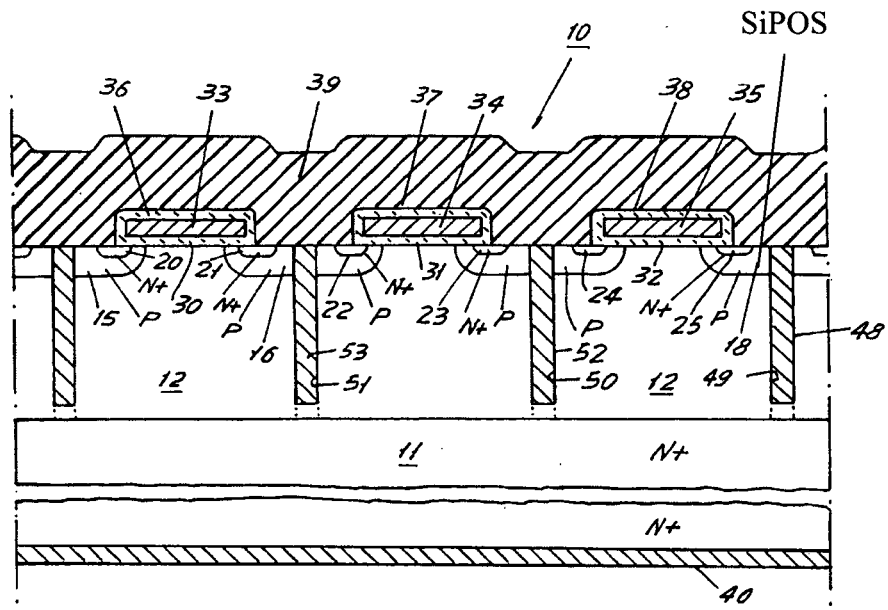
Figures 2, 3A:
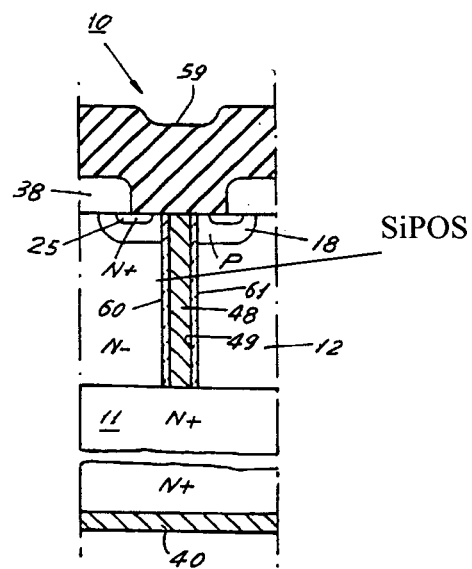
Figures 1, 3B:
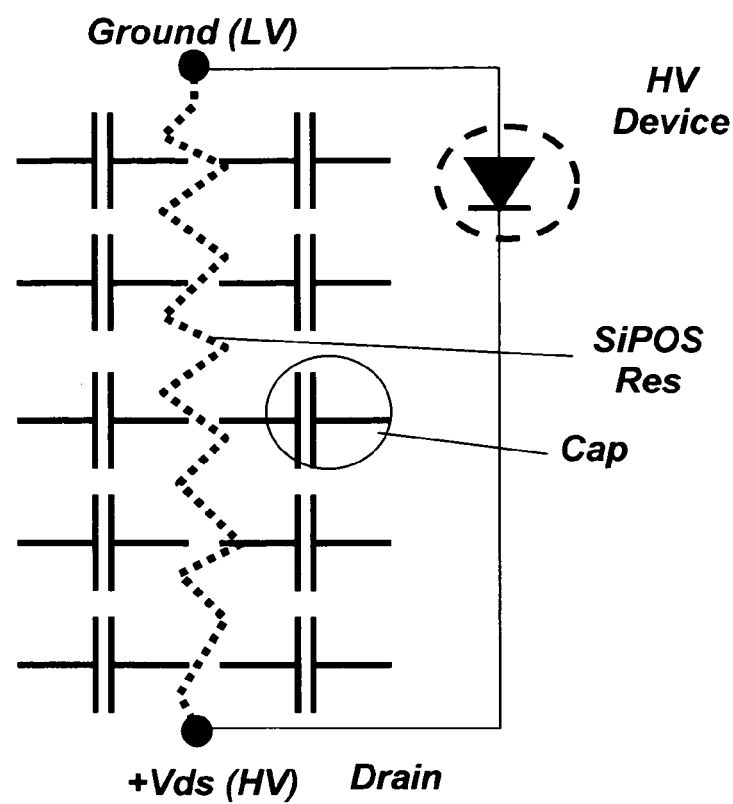
Figures 2, 3B:
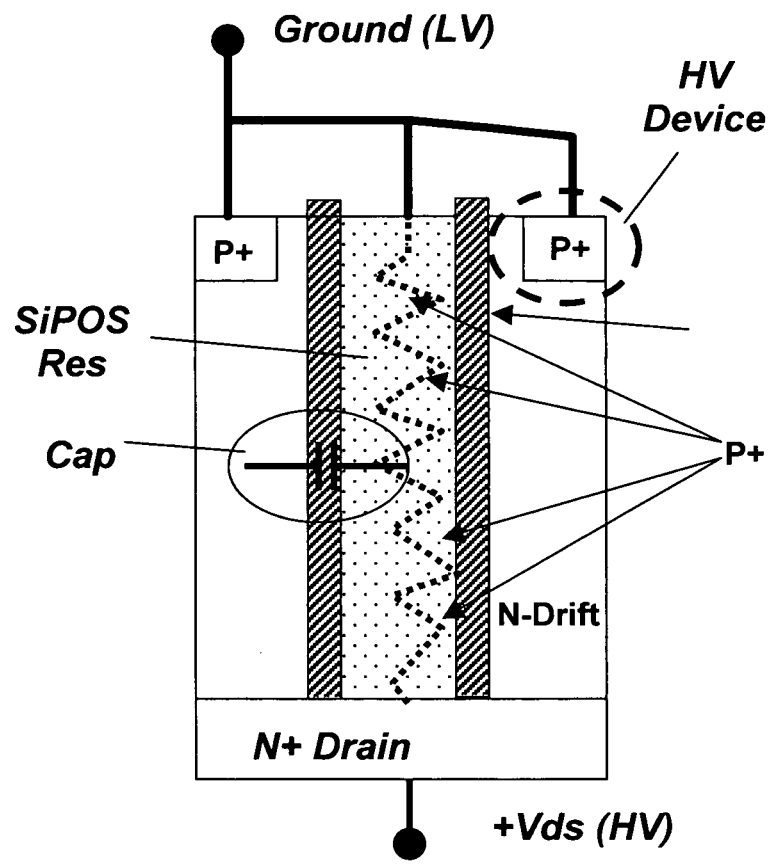
Figures 1, 3C:
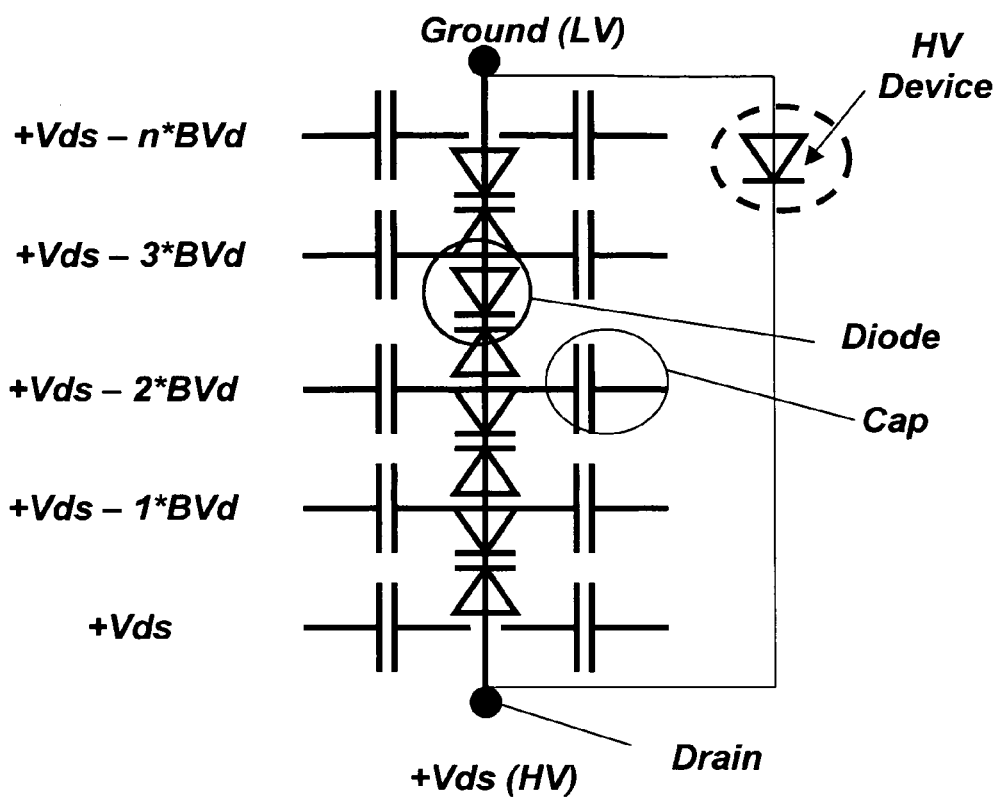
Figures 2, 3C:
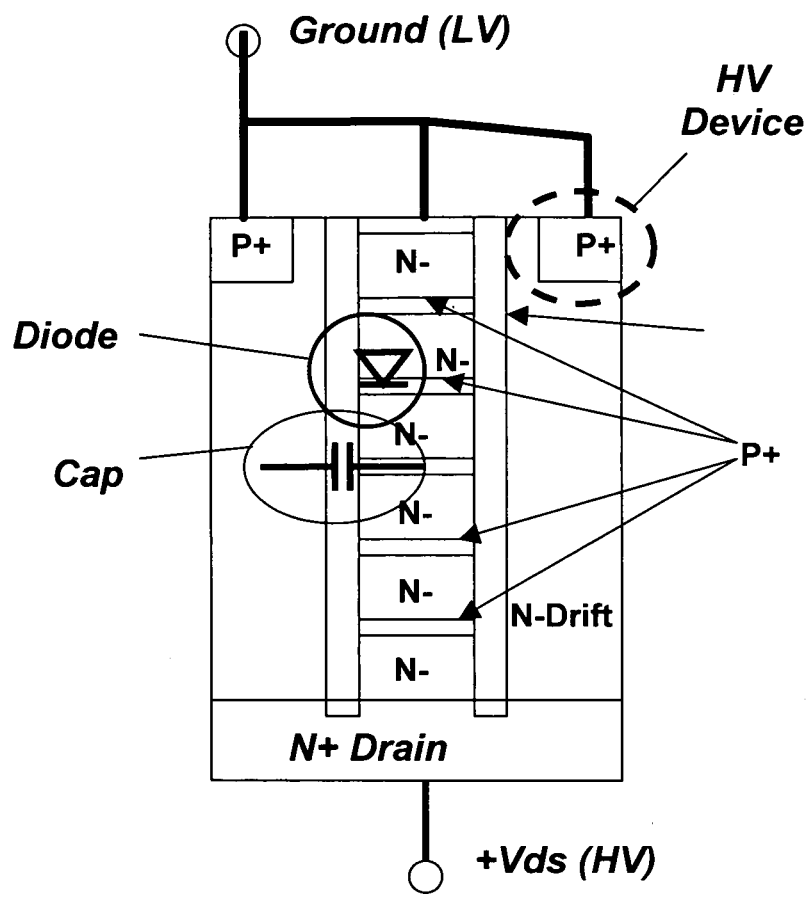
Figure 3D:
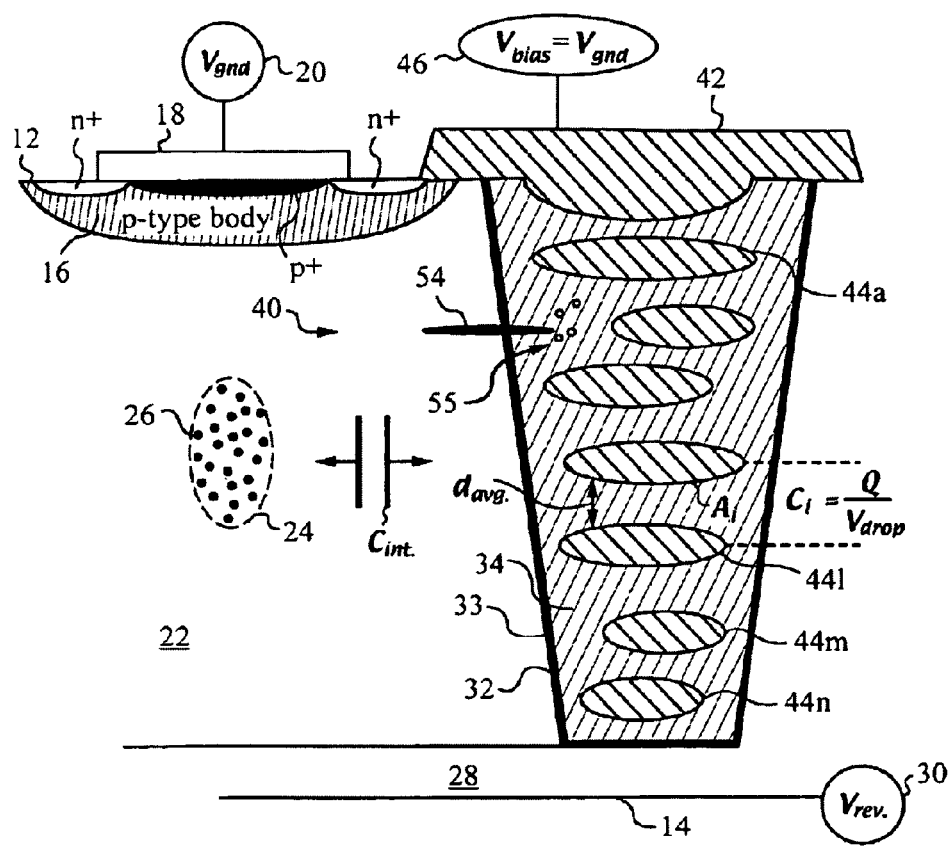
FIG. 3D is a cross sectional view of actual device implementation of the SCD-diode device as shown in a patented disclosure.
Figure 4A:
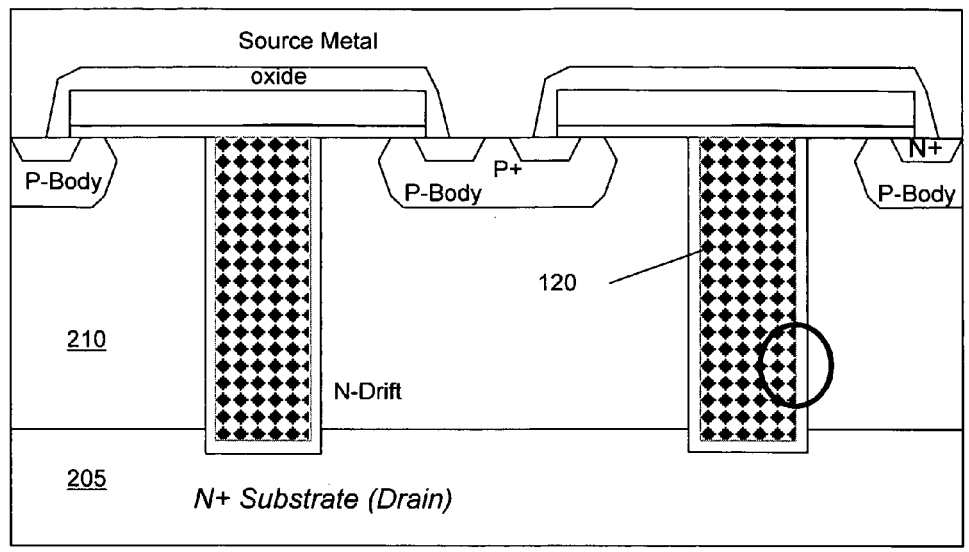
Figures 1, 4A:
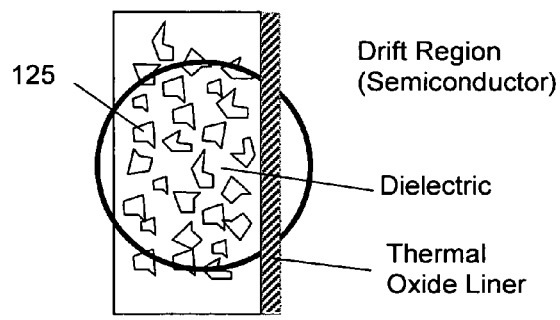
Figures 2, 4A:
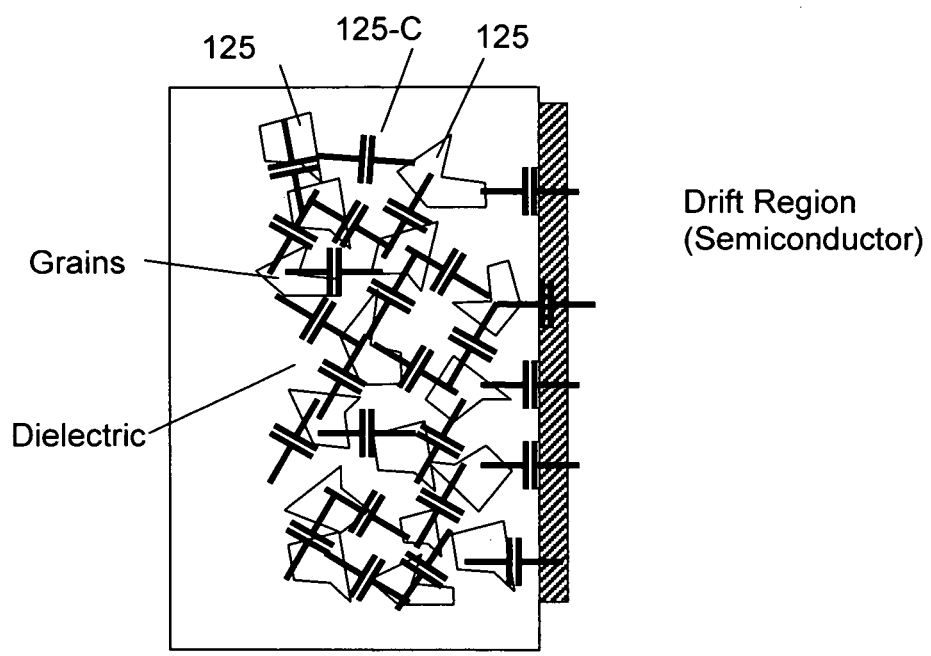

Referring to FIG. 4A for a cross sectional view of a vertical semiconductor device implemented as a vertical N-channel trenched FET device 100. The vertical FET device 100 is formed with a drain terminal 105 on a bottom surface of the semiconductor substrate that supports an N-doped epitaxial layer 110. A plurality of trenches are opened from the top surface of the substrate that extend through the epitaxial layer 110 and extend into the bottom layer 105. The trenches are filled with a dielectric material 120. The dielectric material filling in the trenches comprises a plurality of nano-charge sites 125 as that shown in FIG. 4A-1 where the nano-charge sites 125 are formed through the grains or modules of the dielectric material. The nano-charge sites 125 formed through the grains or modules of the dielectric trench filling material 120 can have spherical, elliptical or random shapes. FIG. 4A-2 further depicts that the coupling between adjacent nano-charge sites 125 forms the nano-capacitors 125-C.

Three-dimensional charge balance is therefore achieved through the charge-couplings established through the coupling between the adjacent nano-charge sites 125 disposed in the trenched gates 120. There is a uniform distribution of the charge coupling because the nano-charge sites 125 are uniformly distributed in the trenched gates 120. Three-dimensional charge balance is achieved because there is coupling between the drain terminal 105 with high bias and the source and gate low bias in two dimensions. Furthermore, there is charge balance because of the distributed drifted region in the third dimension. Unlike the conventional devices, the high breakdown voltage semiconductor power device as shown in FIGS. 4, 4A-1 and 4A-2 no longer uses high resistivity semiconductors such as that implemented in the conventional SiPOS device or circuit elements such as resistors, capacitors, or diodes to achieve high break down voltage as that described above. Instead, uniform three-dimensional charge balance is achieved through modules or grains of the nano-charge sites 125 or nano-crystals in the dielectric materials. The basic principle to devise the novel device configuration is in total opposite from that of the SiPOS devices. In SiPOS devices, the semiconductor portion of the devices is modified to increase the resistivity for the purpose of reducing leakage. In this invention, the leakage is minimized through the use of a dielectric material as insulation against leakage while the embedded and uniformly distributed nano-capacitors 125-C functioning as charge storage to enable a high breakdown voltage of the device.

A device such that shown in FIG. 4A can be implemented with simplified and low cost processes because the trench can be filled with a simple trench-filling process. The trench-filling material is further selected from multiple compatible materials conventionally available and commonly used for filling the trench with well know techniques. The processes for developing the nano-crystals with gains or nodules in the trenches opened in a semiconductor substrate are also well developed and can be accomplished by applying controllable and economical processes. There are broad options for selecting the trench filling materials that may include silicon nano crystals in oxide matrix, implanted metal particles in oxide matrix, nucleated silicon particles, large silicon grains formed out of annealed polysilicon. The nano crystal or grain sized can be optimized for different kinds of applications. Larger semiconductor or conductor particles increase the capacitive coupling and charge containment. Parameters such as implant does, film composition, anneal temperature, sequences, etc., are applied to control the size of the nano-crystals or grains. The device fabrication processes describe below provide some exemplary embodiments and the methods and device configurations are only examples and should not be interpreted as limiting or exhaustive.

FIG. 4A is disclosed as one of many possible embodiments. The structures and methods as disclosed in this invention can be implemented for achieving high voltage applications and reducing series resistance to many types of vertical and horizontal devices. Such devices may include many kinds of transistors including but not limited to MOSFETs, BJTs, JFETs, SiTs, IGBTs, etc. Such devices may also include many kinds of bipolar dives and diodes such as Schottky, avalanche diodes, etc. Such devices can be conveniently and compatibly manufactured with standard foundry equipment and the device structure can be scalable from low to high voltages.

Based on application of nano-crystals in memory cells with the gate oxide layer with layer thickness of 150 Angstroms implanted with nano-crystal, is able to sustain a voltage higher than four volts translated into a voltage gradient of 250 volts/㎛. The nano-crystal distribute over the trenches is able to sustain much higher voltage change as that required over the length of the trenches when applied for high voltage device. For high voltage applications, the maximum voltage is along the vertical drift distance between the bottom drain region that has a high positive bias for N-channel device and the surface with a low voltage or ground source or gate voltage. For a device applied with a breakdown voltage higher than 600 volts, the drift region is about 50 to 60 micrometers. The rate of voltage variation is about 10 volts/纳 m during the operation of such devices compared to a 250 volts/纳 m over the gate layer in the memory application. The lateral voltage variations are negligible compared to the rate of voltage variation over the vertical direction.

Figure 5A:
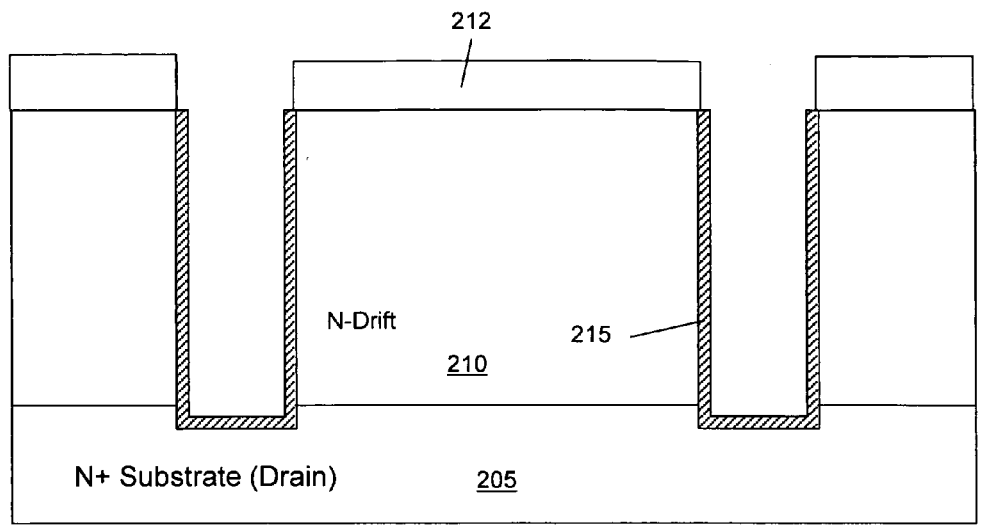
FIGS. 5A to 5H are a series of cross sectional views to illustrate the manufacturing processes to manufacture a device as an exemplary embodiment of this invention.
Figure 5B:
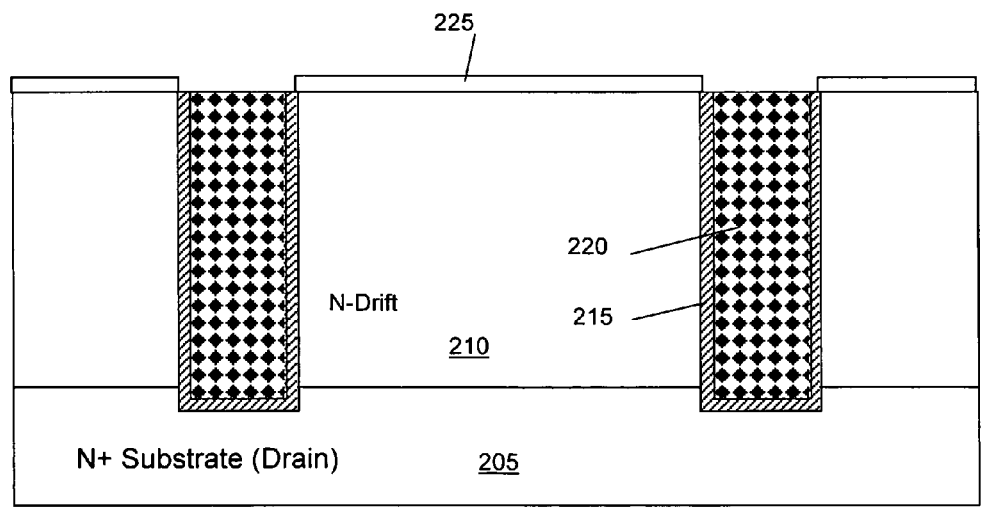
Figure 5C:
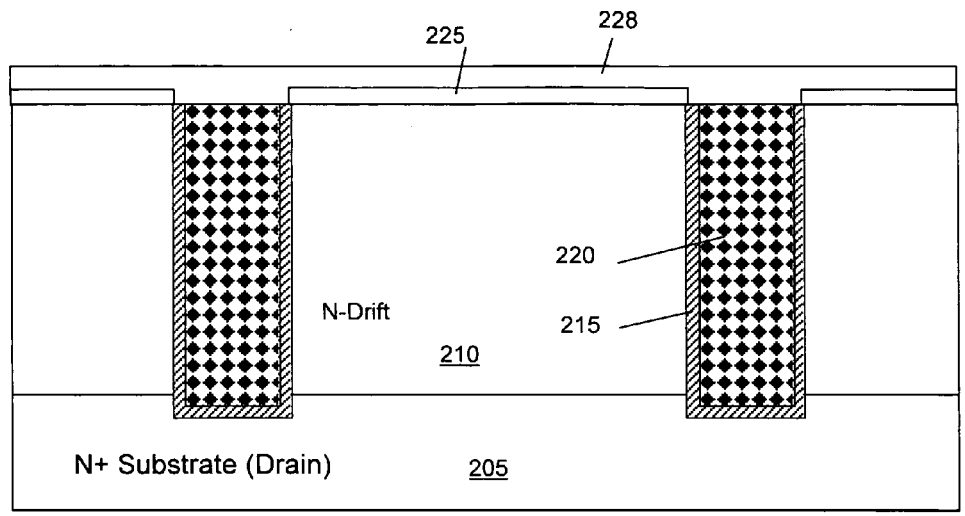
Figure 5D:
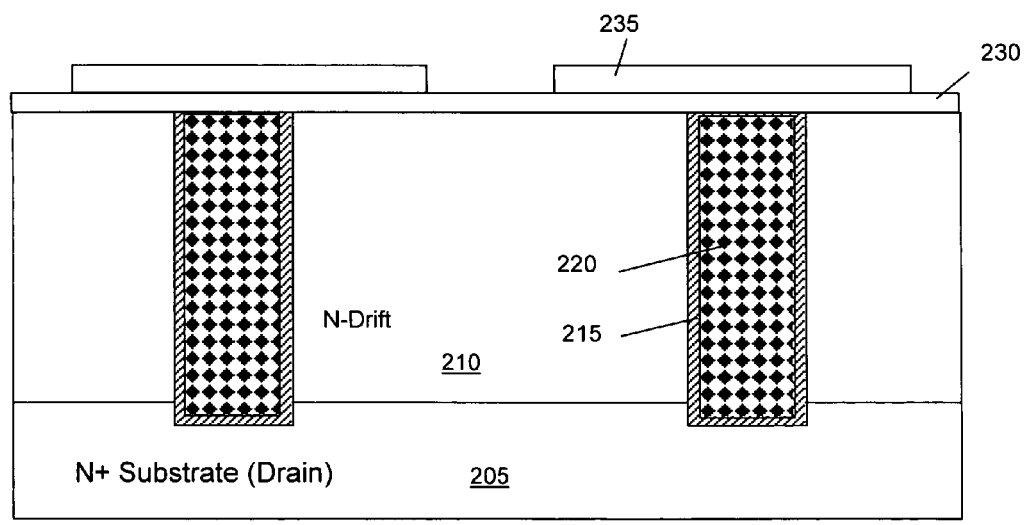

Referring to FIGS. 5A to 5H for series of cross sectional views to illustrate the manufacturing processes for making a device structure as shown in FIG. 3. The processes starts with a silicon substrate that has an N+ doped bottom 205 to function as a drain terminal and a N-epitaxial layer 210 supported on the substrate 205. A hard mask 212 is formed on the top surface through a hard mask deposition process followed with a deep silicon etch step to form a plurality of trenches 214. An optional trench lining oxidation process may be carried out to form an optional thermal oxide layer 215 of about 200 to 500 Angstroms in thickness. The optional trench lining oxide layer 215 may be alternatively formed with a combination of thin thermal oxide and a high temperature oxidation (HTO) process. Conformal Oxide deposition such as HTO oxide is usually deposited using an LPCVD reactor, with Dichlorosilane and Oxygen, at a temperate of 700 to 900 degrees Celsius. In FIG. 5B, a silicon rich oxide deposition is carried out to fill the trench with a trench-filling silicon 220 followed with an annealing process and an oxide etch back to remove thermal oxide from the top of the trenches while leaving oxide layer 225 covering the top surface areas of the substrate. Referring to FIGS. 5C and 5D for the processes of defining the termination region and the active region. After the oxide etch back process as shown in FIG. 5B, a pad oxidation process is performed to grow another oxide layer (not shown). A nitride layer (not shown) is deposited on top of the pad oxide layer. A termination mask (not shown) as an option for implanting dopant into the edges to form the termination ring (not shown) followed by applying an active mask (not shown) to carry out a nitride to define the active area by removing the nitride layer. A local oxidation on silicon (LOCOS) oxide layer 228 is grown in the circumference of the active area. In FIG. 5D, an oxynitride stripping operation is performed followed by a nitride and pad oxide layer removal from the active area in preparation for building the device in the active area. A sacrificial oxide layer is grown on the top surface and then removed for the purpose of removing any damages caused by previous nitride and oxide etching processes then a gate oxide 230 of good quality is grown. A polysilicon deposition is carried out followed by applying a polysilicon gate mask to etch and define the polysilicon gate 235.

Figure 5E:
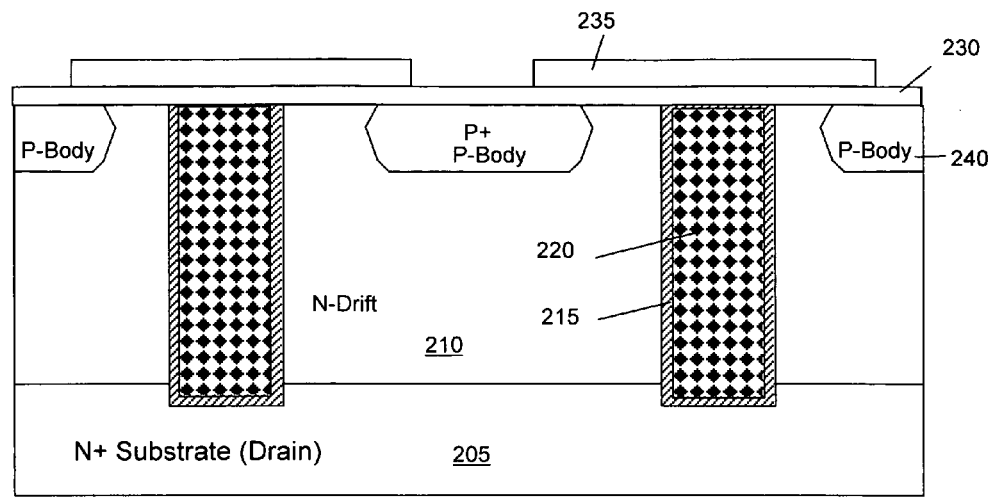
Figure 5F:
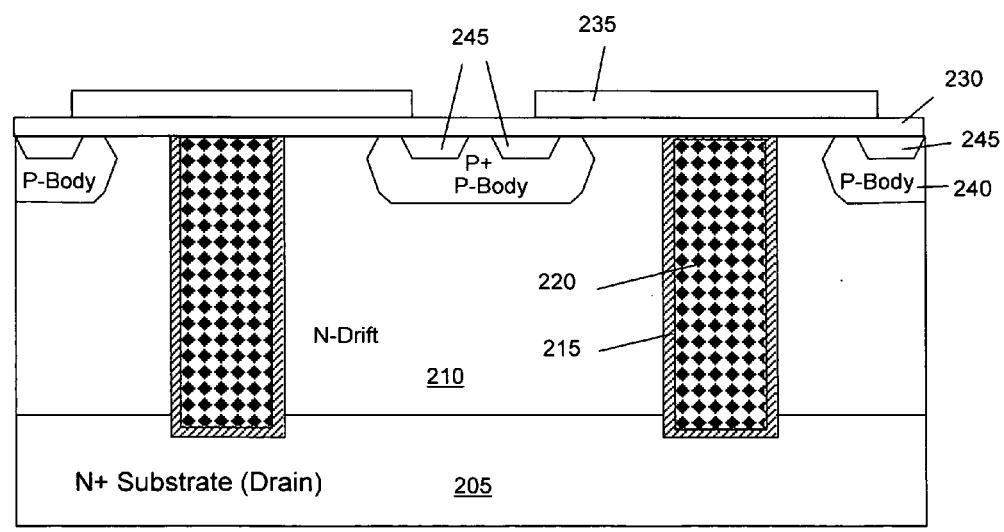
Figure 5G:
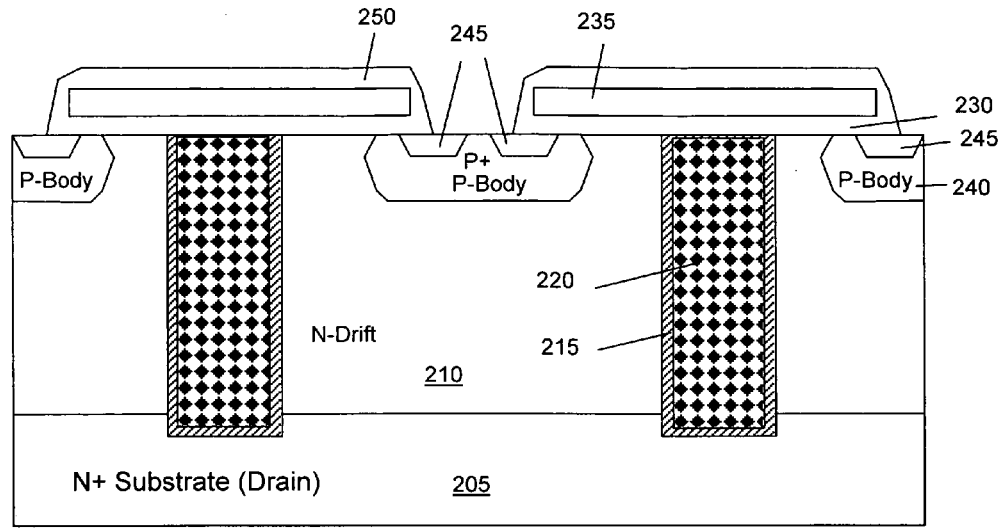
Figure 5H:
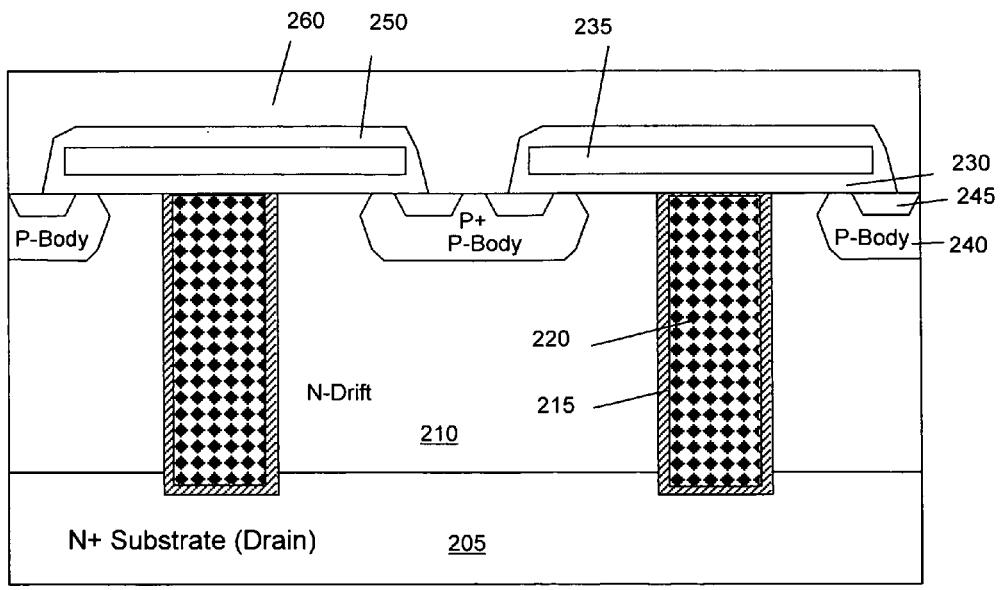

In FIG. 5E, a channel implant to form the P-body region 240 is carried out followed by applying an elevated temperature greater than 1100 degrees Celsius for more than thirty minutes in a nitrogen (N2) environment to drive the channel region 240 and the anneal the dielectric in the trench 220. After the high temperature annealing operation, the silicon rich dielectric 220 in the trench is formed as dielectric material with silicon crystals distributed inside the Oxide. In FIG. 5F, a source mask is applied to carry out a source implant to form the source regions 245 followed by applying an anneal temperature to anneal and drive the source regions 245. In FIG. 5G, a BPSG insulation layer 250 is deposited followed by a BPSG reflow. A contact mask is used to etch the contact openings in the BPSG layer 250 and a deep boron body implant is performed through the contact openings. In FIG. 5H, a metal layer 260 is deposited and then a metal mask (not shown) is applied to pattern the source metal. The manufacturing processes of the device are completed with passivation, pad mask and etch followed by final alloying processes.

Figure 6A:
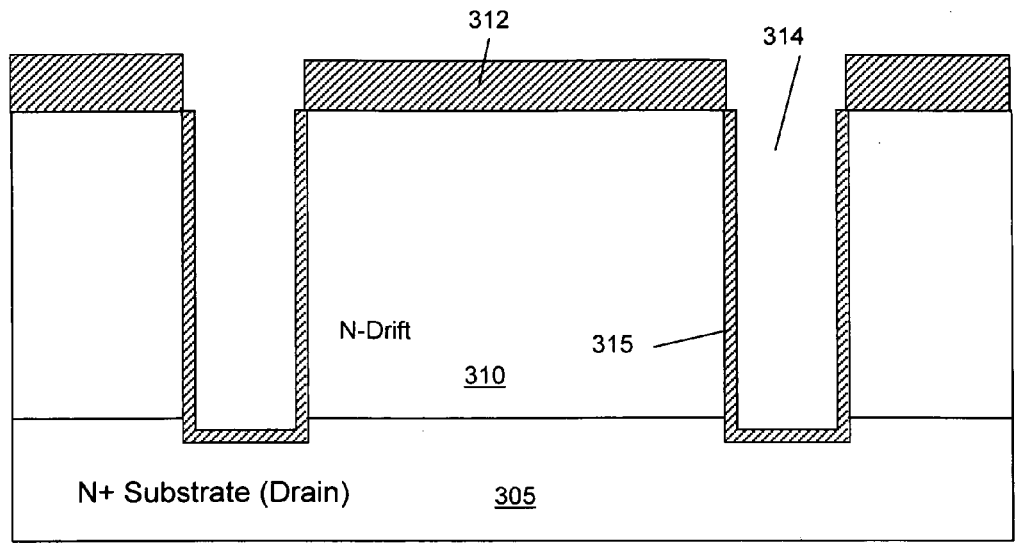
FIGS. 6A to 6E are a series of cross sectional views to illustrate the manufacturing processes to manufacture a device as another exemplary embodiment of this invention.
Figure 6B:
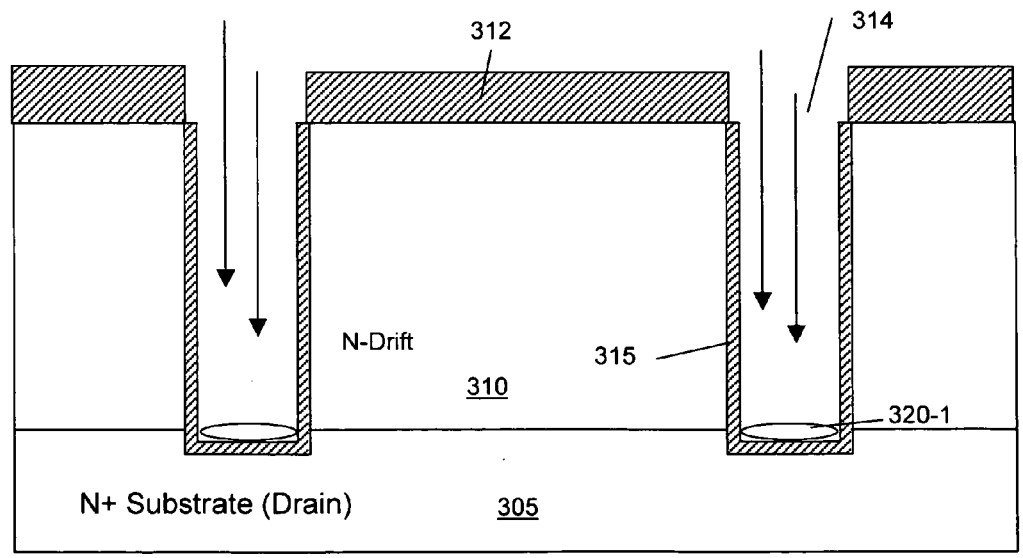
Figure 6C:
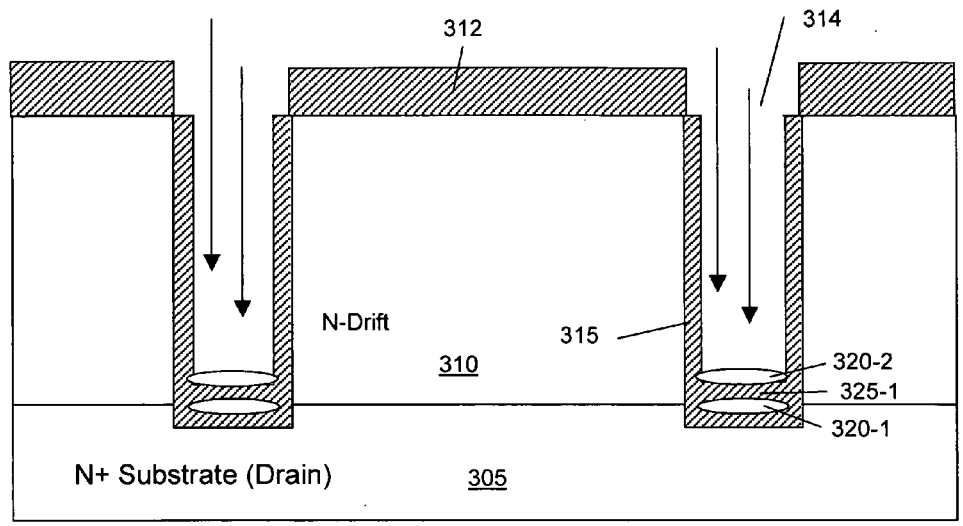
Figure 6D:
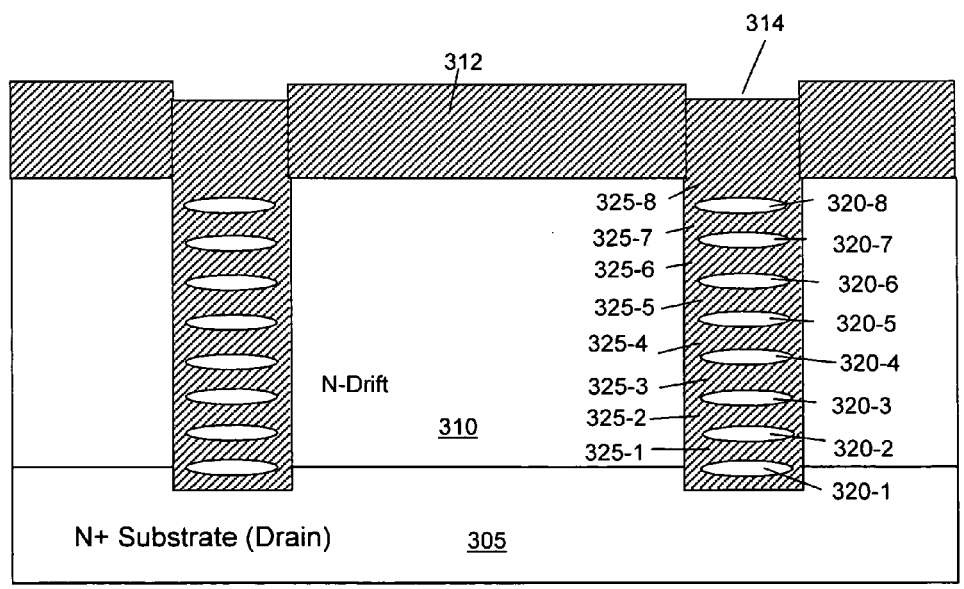
Figure 6E:
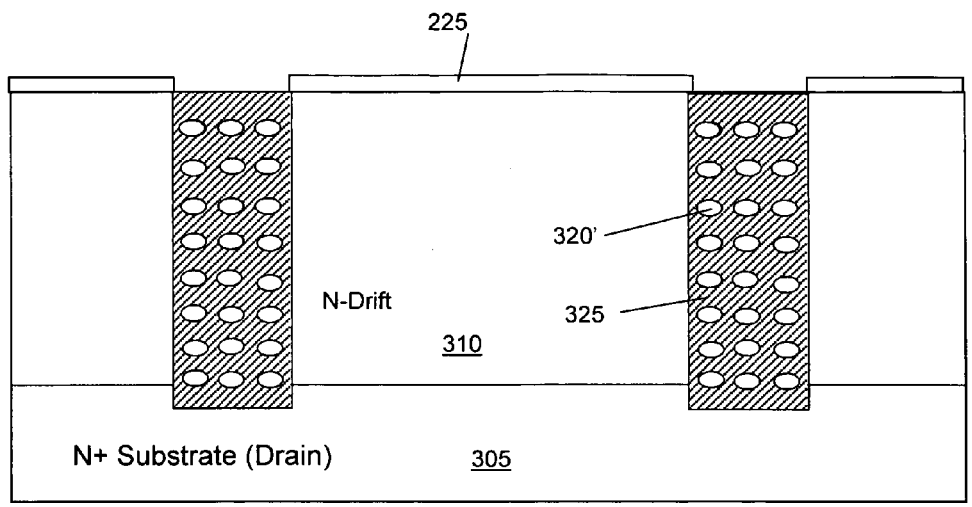

Referring to FIGS. 6A to 6E for series of cross sectional views to illustrate the manufacturing processes for making a device structure for another exemplary embodiment of this invention. The processes starts with a silicon substrate that has a N+ doped bottom 305 to function as a drain terminal and a N-epitaxial layer 310 supported on the substrate 305. A hard mask 312 is formed on the top surface through a hard mask deposition process followed with a deep silicon etch step to form a plurality of trenches 314. A trench lining oxidation process is carried out to form a thermal oxide layer 315 of about 500 Angstroms in thickness. The trench lining oxide layer 315 may optionally be formed with a combination of thermal oxide and a HTO process. In FIG. 6B, an ion implant of Si, Ge or metal(s) in oxide is performed at a zero tilt angle to form a dopant region 320-1 in the trench oxide layer 315. In FIG. 6C, an oxide layer 325-1 is deposited followed by an implant of Si, Ge or metal(s) again into the oxide layer 325-1 at a zero tilt angle to form a dopant region 320-2. In FIG. 6D, the steps of oxide layer deposition and ion implantation processes are repeated to form multiple dopant regions 320-2 to 320-9 and oxide regions 325-2 to 325-9. In FIG. 6E, the hard oxide mask 312 is removed and an anneal process is performed to form dielectric crystals as nano-charge islands 320'. The nano charge-islands are randomly and distributed in a substantially uniform manner in the trench-filling oxide 325. A planarization process is performed to planarize the top surface followed by processes to complete the manufacture of the wafer.

Figure 7A:
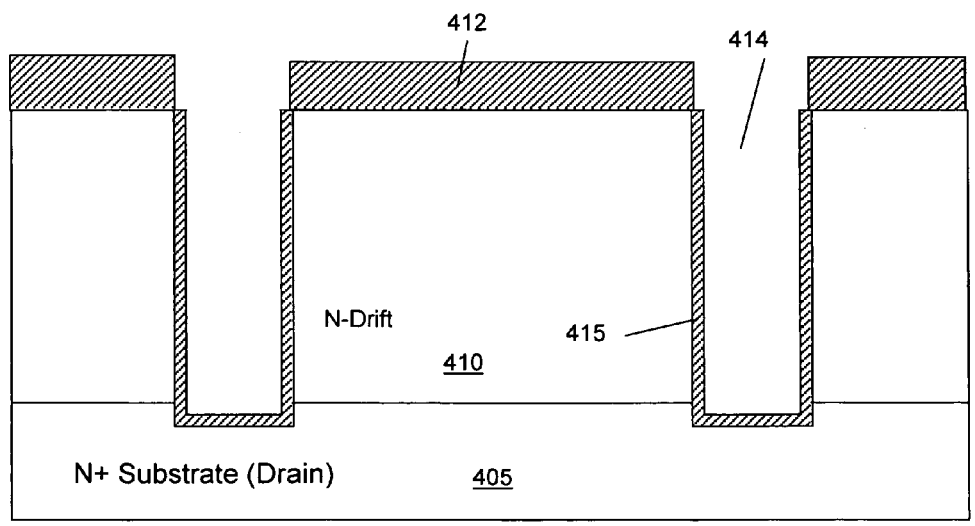
FIGS. 7A to 7D are a series of cross sectional views to illustrate the manufacturing processes to manufacture a device as another exemplary embodiment of this invention.
Figure 7B:
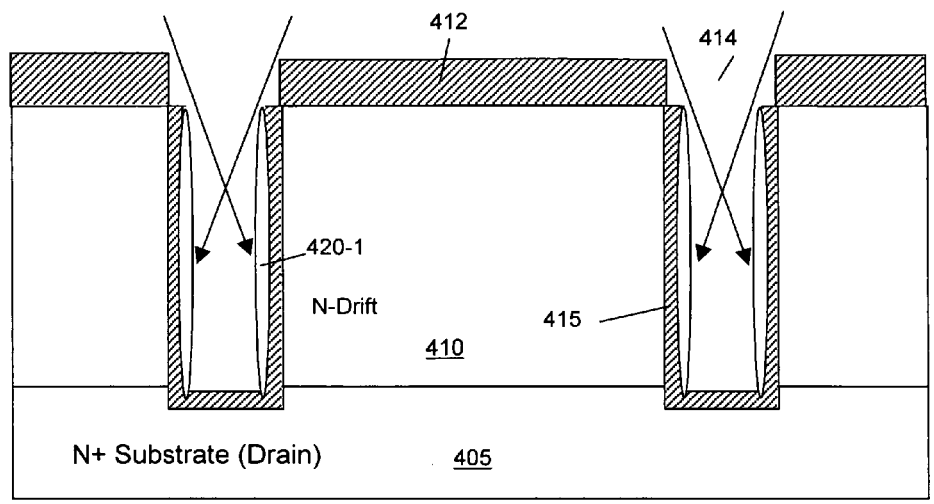
Figure 7C:
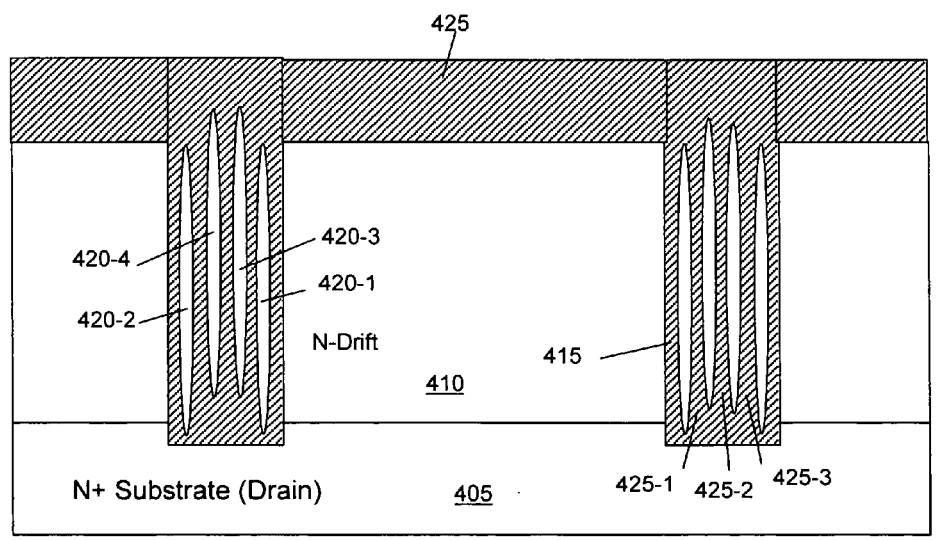
Figure 7D:
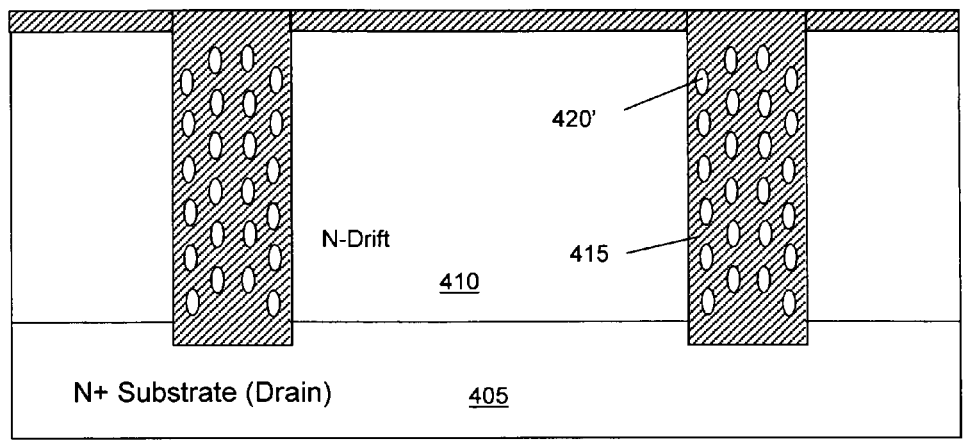

Referring to FIGS. 7A to 7D for series of cross sectional views to illustrate the manufacturing processes for making a device structure for another exemplary embodiment of this invention. The processes starts with a silicon substrate that has a N+ doped bottom 405 to function as a drain terminal and a N-epitaxial layer 410 supported on the substrate 405. A hard mask 412 is formed on the top surface through a hard mask deposition process followed with a deep silicon etch step to form a plurality of trenches 414. A trench lining oxidation process is carried out to form a thermal oxide layer 415 of about 200 to 500 Angstroms in thickness. The trench lining oxide layer 415 may optionally be formed with a combination of thermal oxide and a HTO process. In FIG. 7B, an ion implant of Si, Ge or metal(s) in oxide is performed at a small tilt angle to form a dopant region 420-1 on the oxide layer 415 along the sidewalls of the trench. In FIG. 7C, an oxide layer 425-1 is deposited over the dopant region 420-1 then followed by an implant of Si, Ge or metal(s) again into the oxide layer 425-1 at a small tilt angle to form a dopant region 420-2. Then, the steps of oxide layer deposition and ion implantation processes are repeated to form multiple dopant regions 420-2 to 420-4 and oxide regions 425-2 to 425-3. In FIG. 7D, the hard oxide mask 312 is removed and an anneal process is performed to form dielectric crystals as nano-charge islands 420'. The nano charge-islands 420' are randomly and distributed in a substantially uniform manner in the trench-filling oxide 325. A planarization process is performed to planarize the top surface followed by processes to complete the manufacture of the wafer.

Figure 8A:
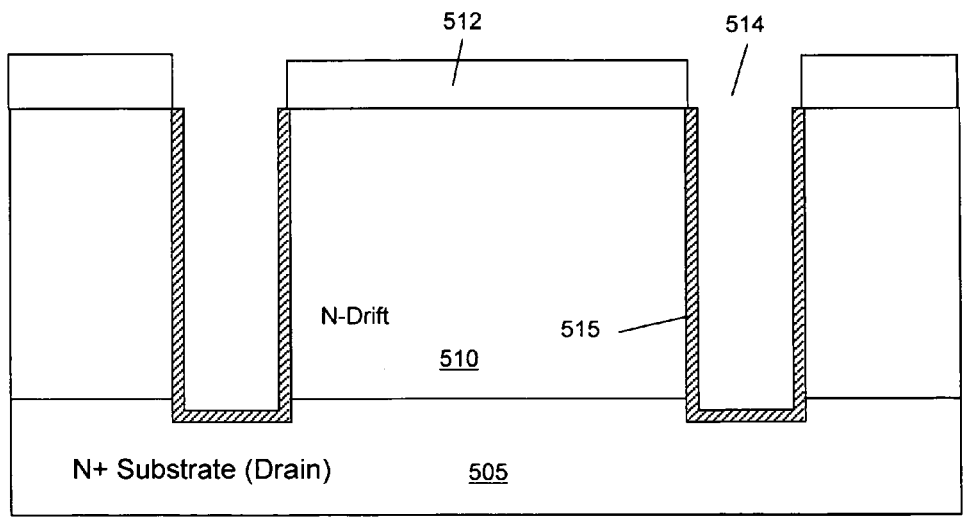
FIGS. 8A to 8D are a series of cross sectional views to illustrate the manufacturing processes to manufacture a device as another exemplary embodiment of this invention.
Figure 8B:
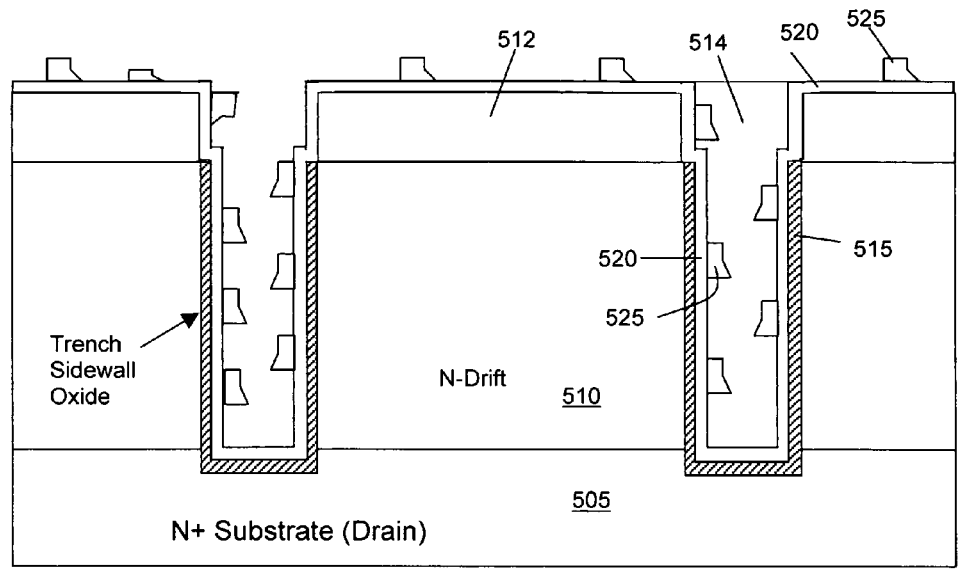
Figure 8C:
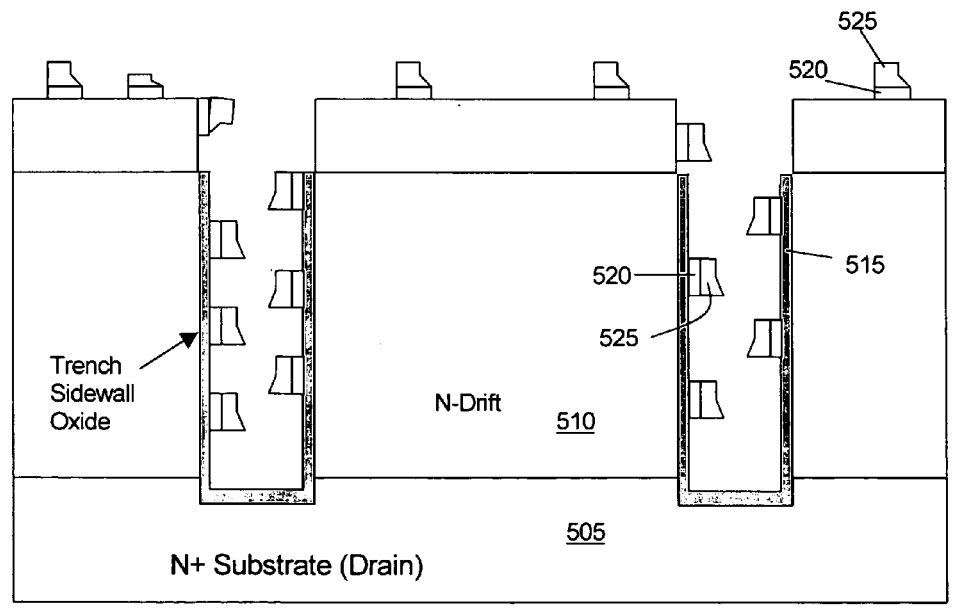
Figure 8D:
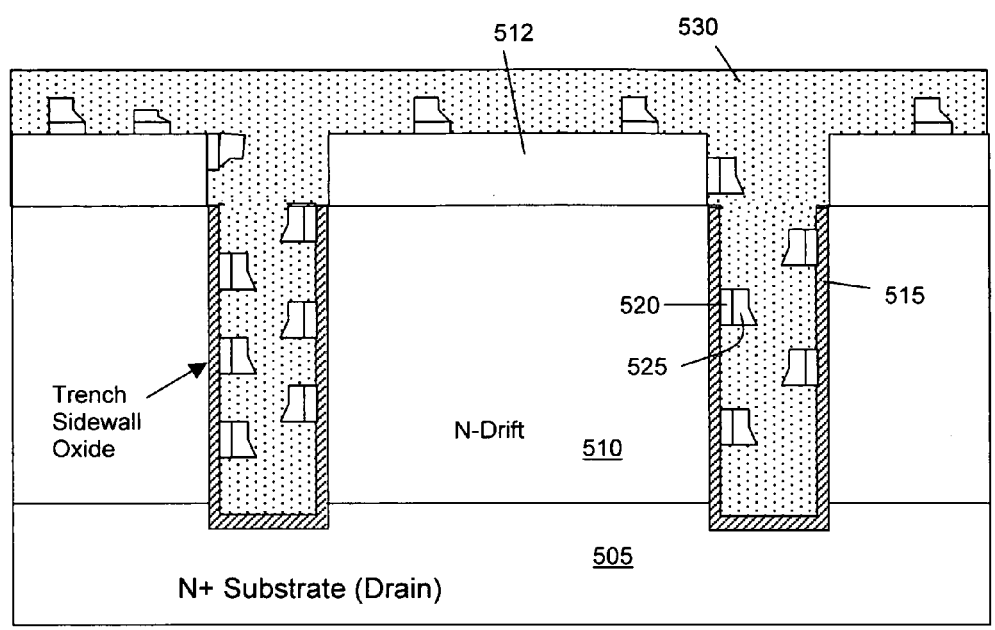

Referring to FIGS. 8A to 8D for series of cross sectional views to illustrate the manufacturing processes for making a device structure for another exemplary embodiment of this invention. The processes starts with a silicon substrate that has a N+ doped bottom 505 to function as a drain terminal and a N-epitaxial layer 510 supported on the substrate 505. A hard mask 512 is formed on the top surface through a hard mask deposition process followed with a deep silicon etch step to form a plurality of trenches 514. A trench lining oxidation process is carried out to form a thermal oxide layer 515 of about 500 Angstroms in thickness. The trench lining oxide layer 515 may optionally be formed with a combination of thermal oxide and a HTO process. In FIG. 8B, a seed layer 520 that may be composed of Ti, TiN, PolySi as seed layer material deposited over the trench sidewalls and the top surface then the silicon particles 525 are grown through surface mobility that leads to nucleation when thin films are deposited as disclosed in U.S. Pat. No. 6,440,795. In FIG. 8C, the seed layer 520 is selectively etched. In FIG. 8D, a conformal oxide deposition is carried out to deposit a conformal oxide layer 530 overlaying the wafer surface. Optionally, the process of manufacturing may be repeated with the silicon grain formation processes by repeating the deposition to fill the trench with layers of nucleated particles covered by oxide until the trench is filled then the sequence is just a repeat of the processes described above including the step of deposition, nucleation, etch, deposit oxide, etc. Then a planarization process is carried out to planarize the top surface followed by the steps similar to that shown in FIGS. 5G to 5H to complete the wafer manufacturing process.

Figure 9A:
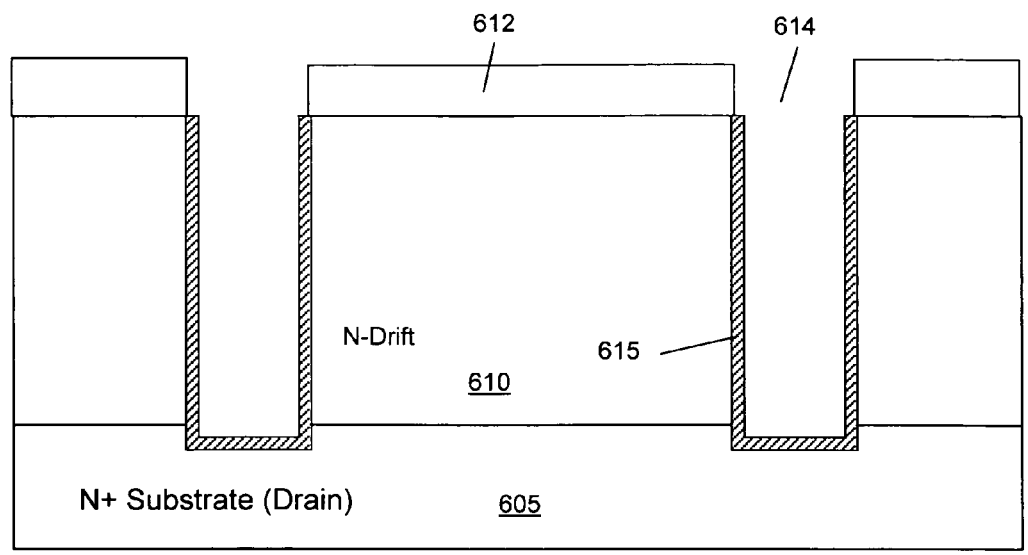
FIGS. 9A to 9E are a series of cross sectional views to illustrate the manufacturing processes to manufacture a device as another exemplary embodiment of this invention.
Figure 9B:
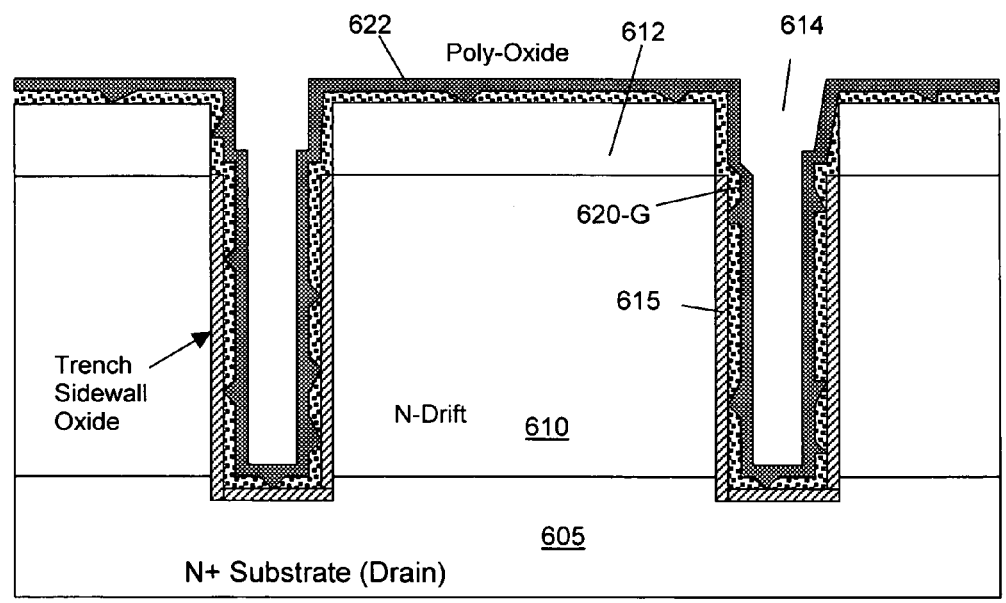
Figure 9C:
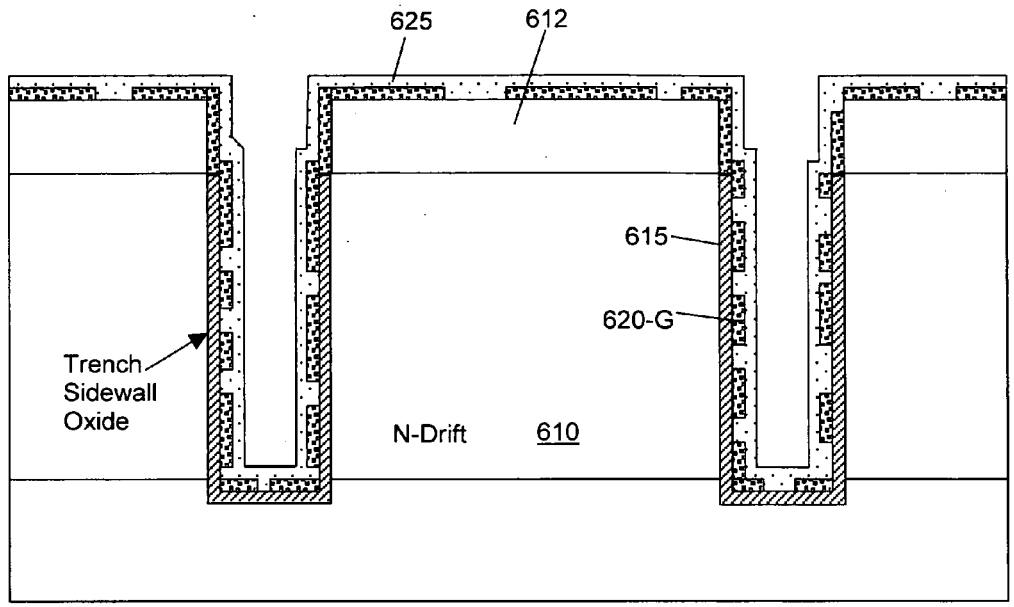
Figure 9D:
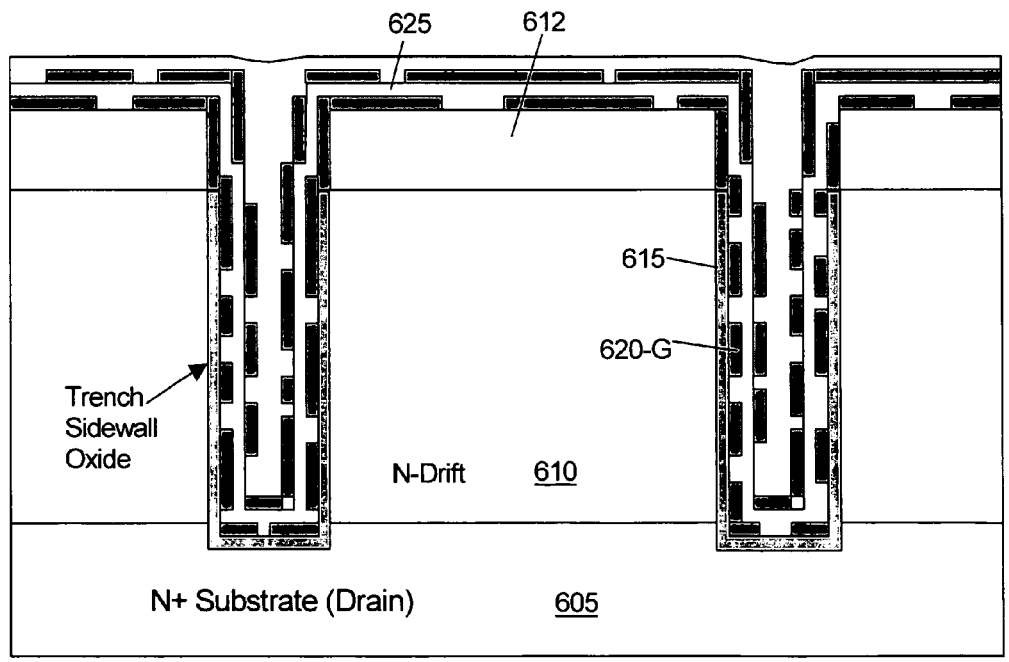
Figure 9E:
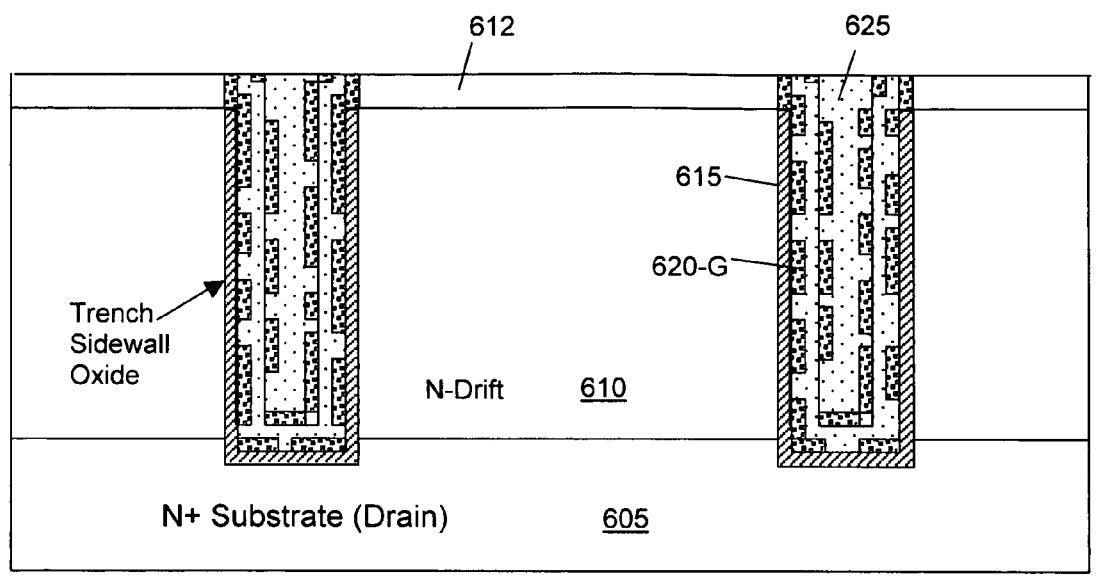

Referring to FIGS. 9A to 9E for series of cross sectional views to illustrate the manufacturing processes for making a device structure for another exemplary embodiment of this invention. The processes starts with a silicon substrate that has an N+ doped bottom 605 to function as a drain terminal and a N-epitaxial layer 610 supported on the substrate 605. A hard mask 612 is formed on the top surface through a hard mask deposition process followed with a deep silicon etch step to form a plurality of trenches 614. A trench lining oxidation process is carried out to form a thermal oxide layer 615 of about 200 to 500 Angstroms in thickness. The trench lining oxide layer 615 may optionally be formed with a combination of thermal oxide and a HTO process. In FIG. 9B, a polysilicon layer 620 with a layer thickness of 0.5 to 1.0 micrometer is deposited. The polysilicon layer 620 is doped with N++ phosphorous dopant if not in-situ doped. A polysilicon anneal and oxidation is carried out at an anneal temperature substantially 1050 degrees Celsius is carried out thus forming an oxide layer 622 covering the surface of the polysilicon layer 620 with a layer thickness of about 0.1 to 0.2 micrometers. The polysilicon layer 620 is formed with grain boundaries separating the grains 620-G. In FIG. 9C, a wet etch is carried out to remove the oxide layer 622 followed by repeated oxidation and etch process to further isolate the polysilicon grains 620-G. Then a conformal oxide layer 625 is deposited by a HTO or TEOS process. In FIG. 9D, the processes as described in FIGS. 9B and 9C are repeated to show two polysilicon deposition and grain formation sequences as an exemplary embodiment. In FIG. 9E, a planarization process is performed to removed the hard mask 612 followed by processes of pad oxidation, nitride layer formation, LOCOS, strip nitride operations, sacrificial oxidation process, gate oxide layer formation, polysilicon layer deposition, body region implant, etc, to complete the wafer manufacturing processes.

Figure 10A:
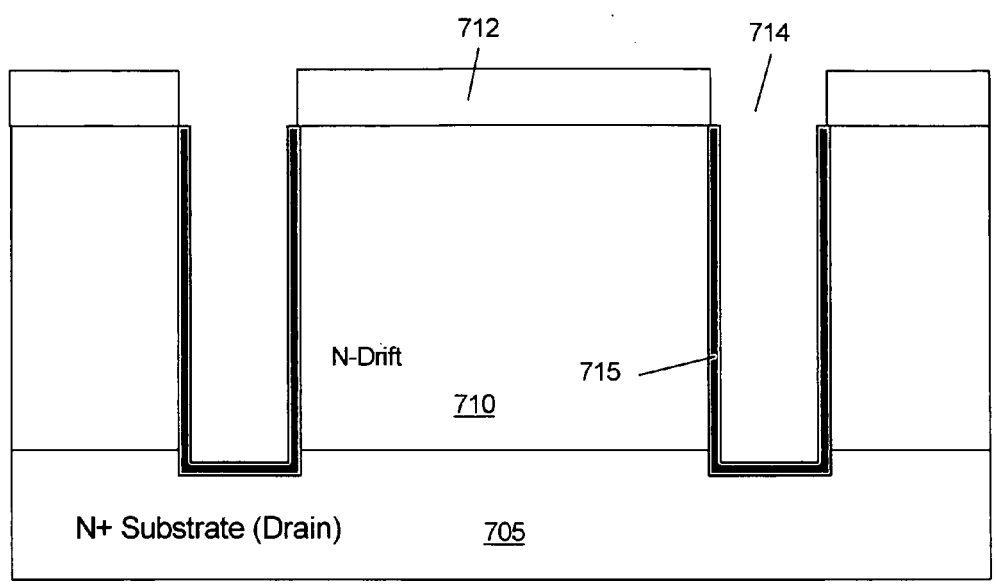
FIGS. 10A to 10E are a series of cross sectional views to illustrate the manufacturing processes to manufacture a device as another exemplary embodiment of this invention.
Figure 10B:
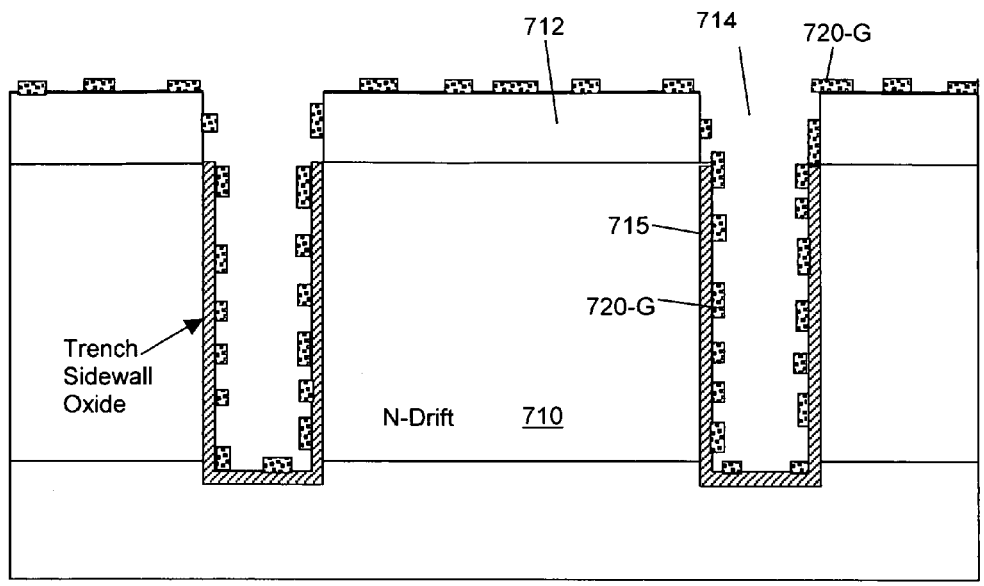
Figure 10C:
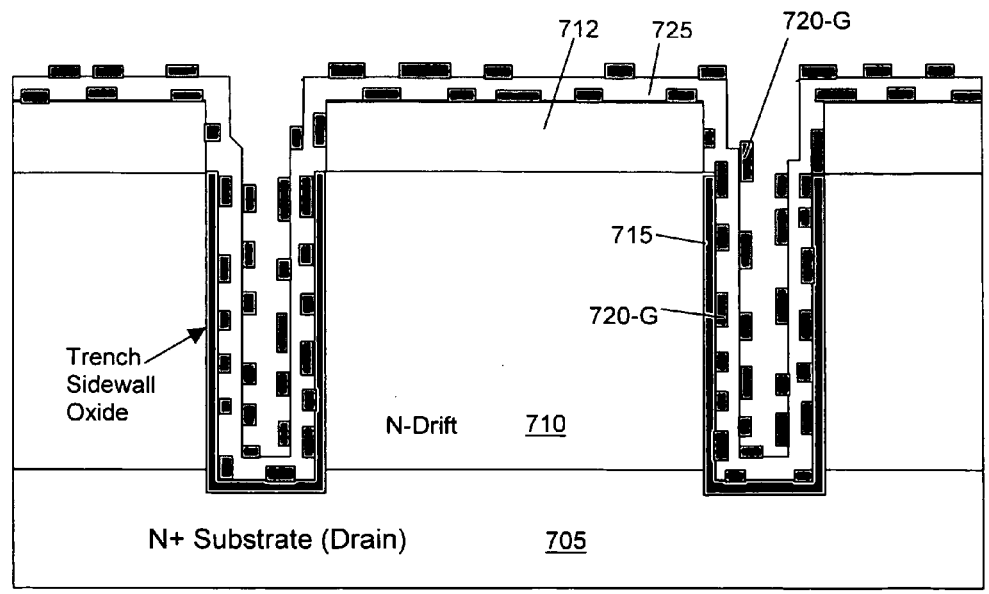
Figure 10D:
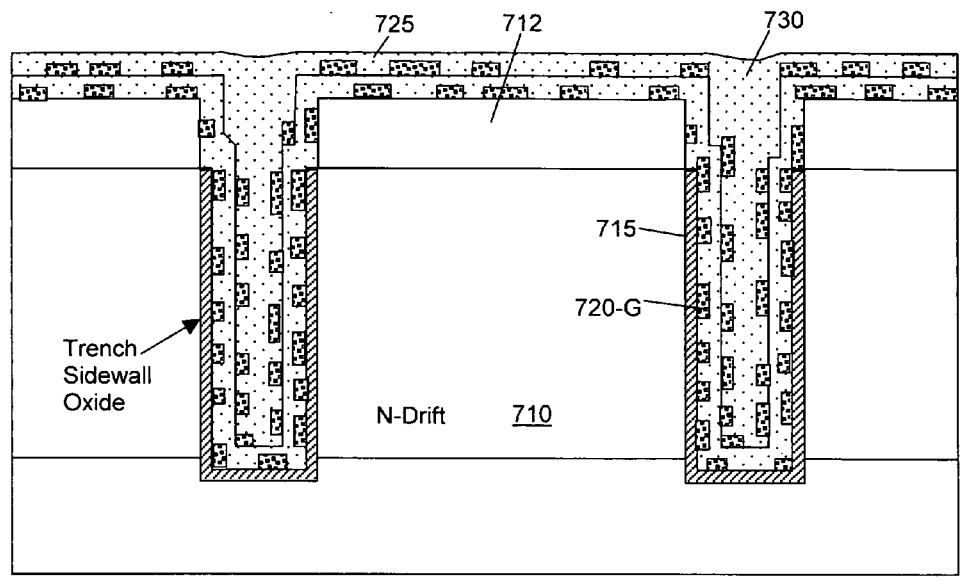
Figure 10E:
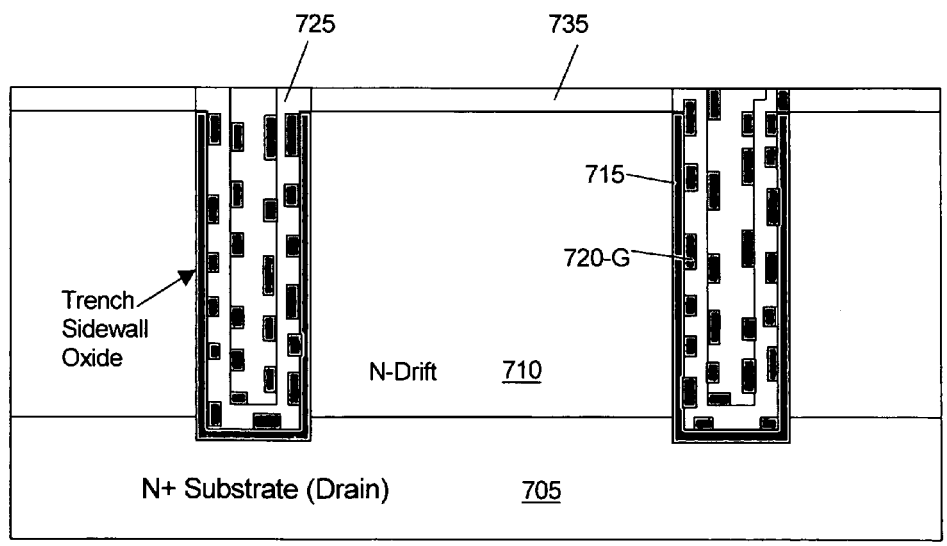

Referring to FIGS. 10A to 10C for series of cross sectional views to illustrate the manufacturing processes for making a device structure for another exemplary embodiment of this invention. The processes starts with a silicon substrate that has an N+ doped bottom 705 to function as a drain terminal and a N-epitaxial layer 710 supported on the substrate 705. A hard mask 712 is formed on the top surface through a hard mask deposition process followed with a deep silicon etch step to form a plurality of trenches 714. A trench lining oxidation process is carried out to form a thermal oxide layer 715 of about 200 to 500 Angstroms in thickness. The trench lining oxide layer 715 may optionally be formed with a combination of thermal oxide and a HTO process. In FIG. 10B, a polysilicon layer 720 is deposited at high temperature with a layer thickness of 100 nanometers. The polysilicon layer 720 is formed with grain formation shaped as nano crystals to function as charge-islands. The process may proceed optionally with thermal oxidation to further isolate passivate the silicon grains 720-G. In FIG. 10C, a conformal oxide layer 725 is deposited to cover the silicon grains 720-G. The processes may optionally proceed with regrowth of silicon grains on top of the conformal oxide layer 725 by repeating the above processes. The processes as described above can be carried out by another method of alternating gas input types in CVD to deposit multi-layered structure of Si.SiO2/Si/SiO2 parallel to the wall and bottom of the trench. The very thin silicon layers forms as thin silicon islands parallel to the sidewalls and bottom surface of the trench that enable enough capacitive coupling between each other. In FIG. 10D, a conformal oxide fill 730 is deposited to fill the trench with the silicon oxide. In FIG. 10E, the hard mask 712 is removed and a planarization process is carried out to planarize the top surface the wafer manufacturing processes are completed following the standard processes described above.

Figure 11A:
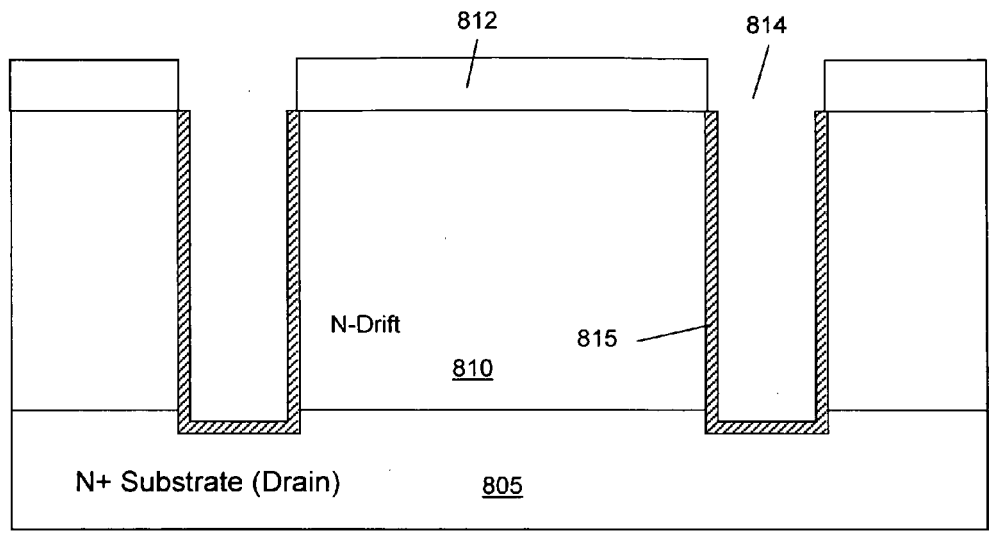
FIGS. 11A to 11C are a series of cross sectional views to illustrate the manufacturing processes to manufacture a device as another exemplary embodiment of this invention.
Figure 11B:
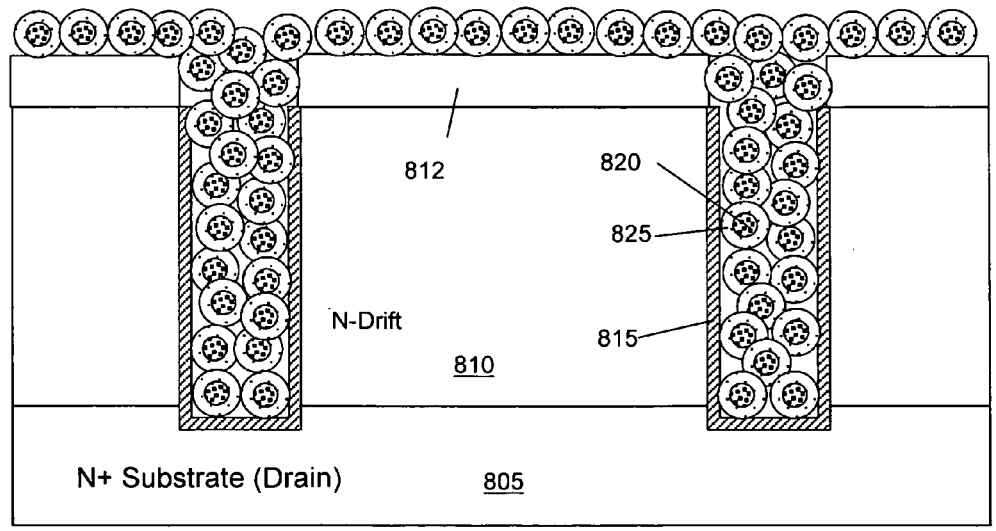
Figure 11C:
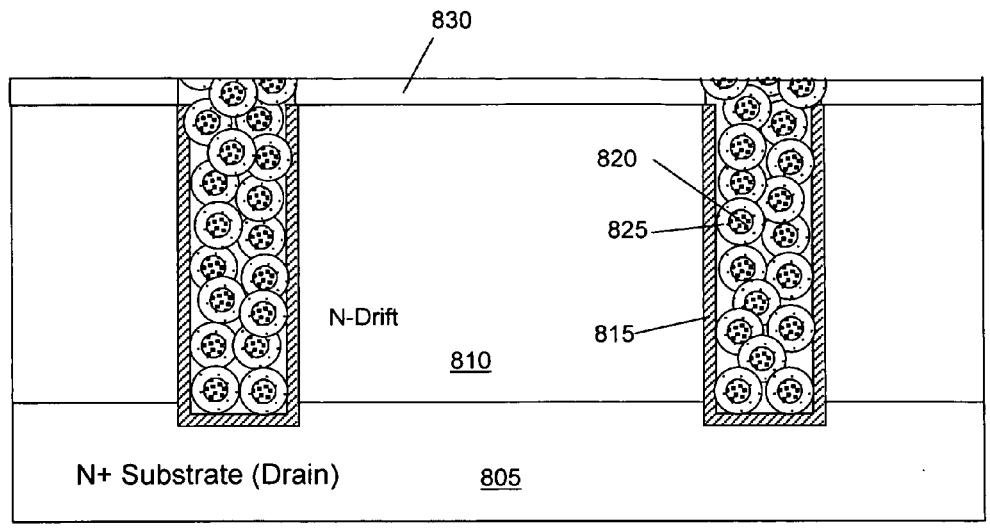

Referring to FIGS. 11A to 11C for series of cross sectional views to illustrate the manufacturing processes for making a device structure for another exemplary embodiment of this invention. The processes starts with a silicon substrate that has an N+ doped bottom 805 to function as a drain terminal and a N-epitaxial layer 810 supported on the substrate 805. A hard mask 812 is formed on the top surface through a hard mask deposition process followed with a deep silicon etch step to form a plurality of trenches 814. A trench lining oxidation process is carried out to form a thermal oxide layer 815 of about 200 to 500 Angstroms in thickness. The trench lining oxide layer 815 may optionally be formed with a combination of thermal oxide and a HTO process. In FIG. 11B, a process is applied to form the silicon nano-crystals in the trenches 814 by pyrolysis of SiH4. Then an oxidation process is performed to oxidize the silicon nano-crystals 820 in the oxidation chamber. The nano-crystals 820 with oxide cells may also be deposited into the chamber then the trench is filled with the electrically isolated silicon nano-crystals 820. In FIG. 11C, a conformal oxide layer 825 is deposited to cover the nano-crystals 820. Then, the processes proceed with a removal of the hard mask 812 and a planarization process is carried out to planarize the top surface the wafer manufacturing processes are completed following the standard processes described above.

Figure 1A:
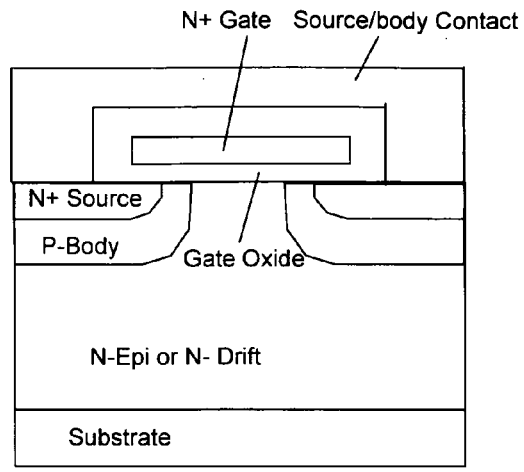
FIGS. 1A and 1B are cross sectional view and performance diagram illustrated as Rsp versus breakdown voltage respectively for illustrating the configuration and performance of a first type of conventional high voltage vertical devices.
Figure 1B:
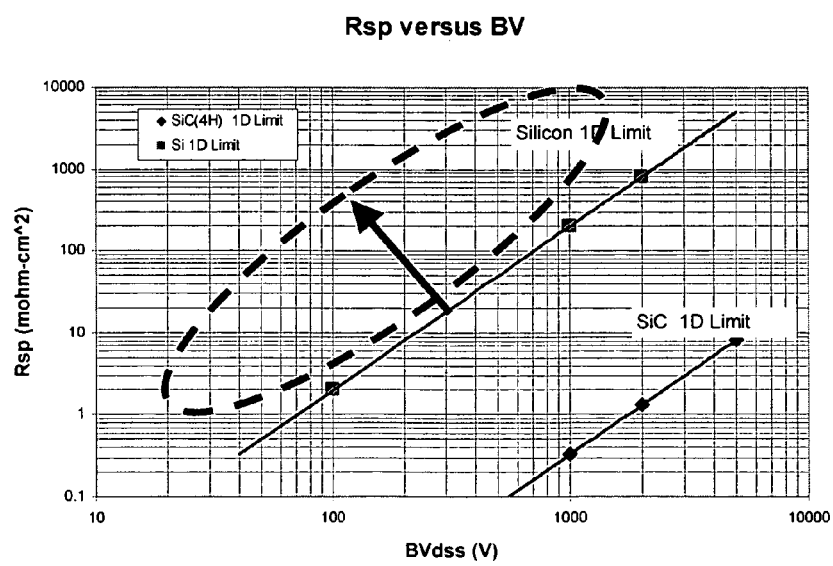
Figure 12A:
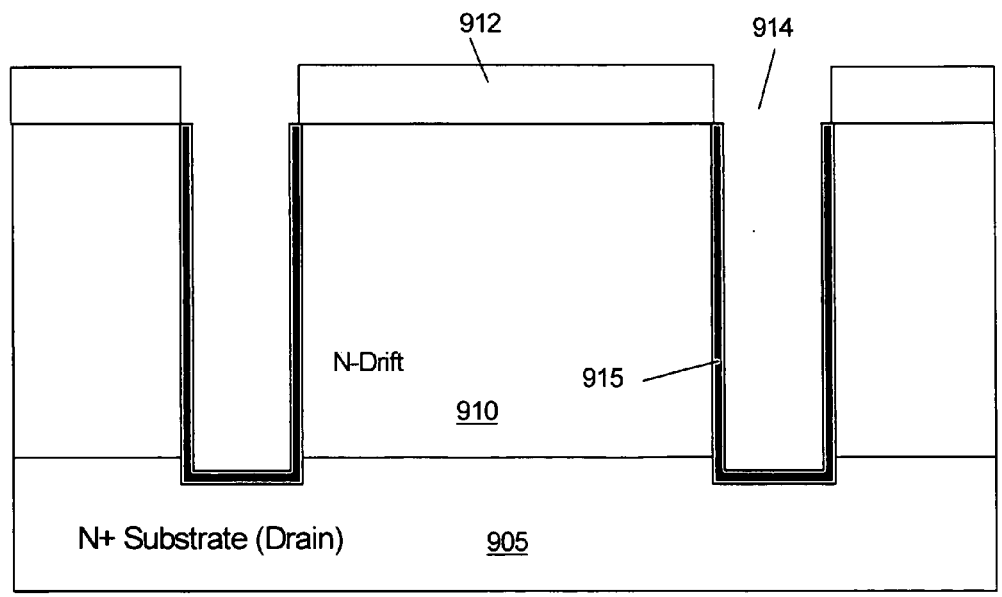
FIGS. 12A to 12C are a series of cross sectional views to illustrate the manufacturing processes to manufacture a device as another exemplary embodiment of this invention.
Figure 12B:
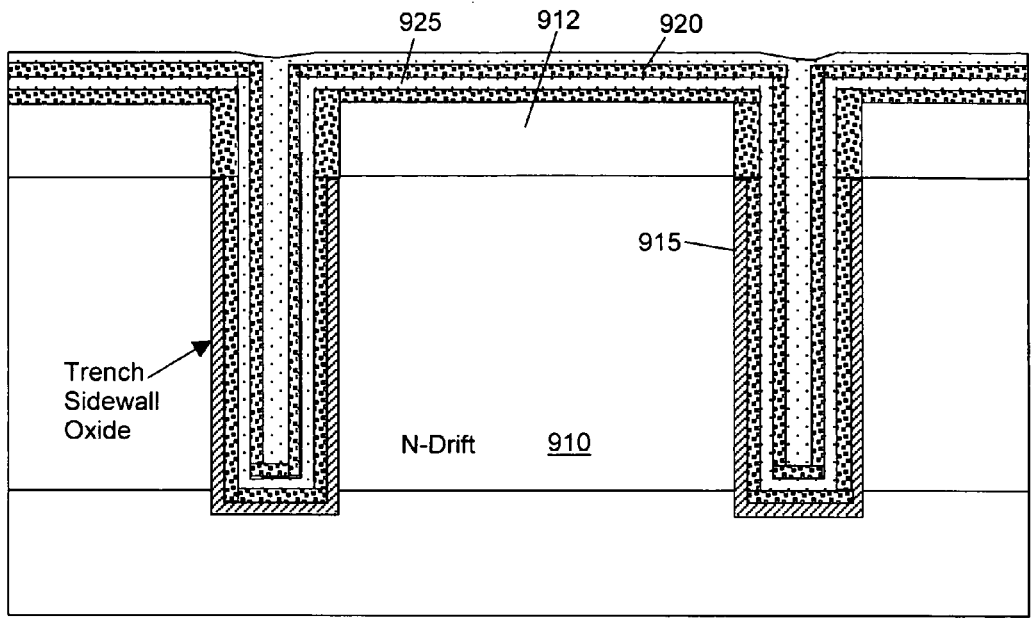
Figure 12C:
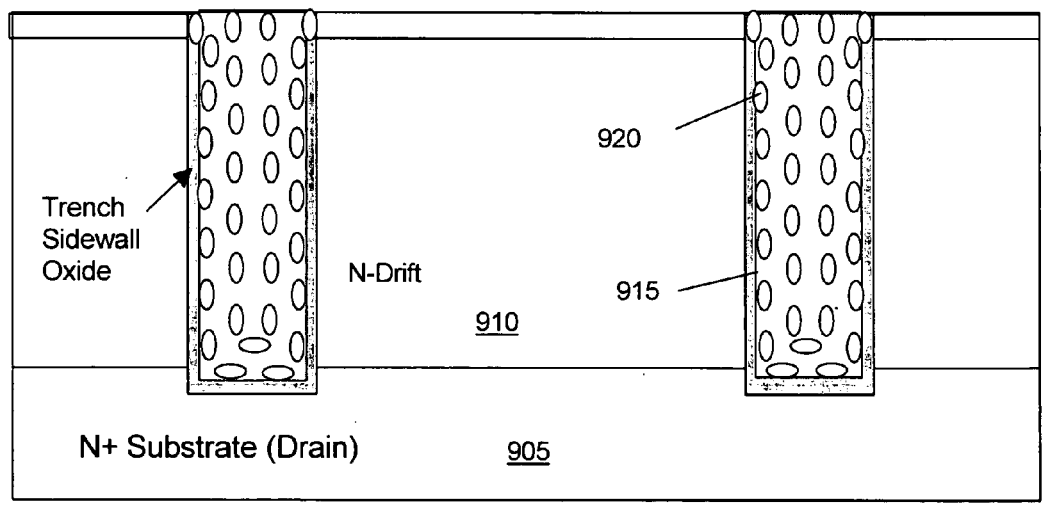

Referring to FIGS. 12A to 12C for series of cross sectional views to illustrate the manufacturing processes for making a device structure for another exemplary embodiment of this invention. The processes starts with a silicon substrate that has an N+ doped bottom 905 to function as a drain terminal and a N-epitaxial layer 810 supported on the substrate 905. A hard mask 912 is formed on the top surface through a hard mask deposition process followed with a deep silicon etch step to form a plurality of trenches 914. A trench lining oxidation process is carried out to form a thermal oxide layer 915 of about 200 to 500 Angstroms in thickness. The trench lining oxide layer 915 may optionally be formed with a combination of thermal oxide and a HTO process. In FIG. 12B, a SiO2 layer 925 is deposited followed by deposition of a SiOx layer 920 where X is adjusted to enable relatively large nano-crystals in an annealing process following the deposition processes. The depositions of SiO2 and SiOx layers are repeated to form multiple layers of SiO2 layers 925 and SiOx layer 920. Then a conforming SiO2 layer 930 is formed on top and to fill the trench. In FIG. 12C, an annealing process is carried out to form large grains of nano-crystals 920 of silicon as charge-islands uniformly and randomly distributed in the trench. In FIG. 1C, the hard mask 912 is removed and a planarization process is carried out to planarize the top surface. Then, the wafer manufacturing processes are completed following the standard processes described above.

According to above descriptions, this invention discloses a method for manufacturing a semiconductor device. The method includes a step of forming an insulation trench extending from a top region through an intermediate region toward a bottom region to provide a controllable current path traversing through the intermediate region. The method further includes a step of filling the insulating trench with randomly and substantially uniformly distributed nano-nodules as charge-islands for electrically coupling with the intermediate region for continuously and uniformly distributing a voltage drop through the current path. In an exemplary embodiment, the step of filling the insulating trench with the distributed nano-nodules further includes steps of depositing and a silicon rich oxide and annealing the silicon rich oxide to precipitate nano-particles. In an exemplary embodiment, the step of filling the insulating trench with the distributed nano-nodules further includes steps of depositing and a Ge rich oxide and annealing the Ge rich oxide to precipitate nano-particles. In an exemplary embodiment, the step of filling the insulating trench with the distributed nano-nodules further includes steps of filling the insulating trench with a dielectric and implanting Si ions into the dielectric in the insulating trench followed by an annealing process. In an exemplary embodiment, the step of filling the insulating trench with the distributed nano-nodules further includes steps of filling the insulating trench with a dielectric and implanting Ge ions into the dielectric in the insulating trench followed by an annealing process. In an exemplary embodiment, the step of filling the insulating trench with the distributed nano-nodules further includes steps of filling the insulating trench with a dielectric and implanting semiconductor ions into the dielectric in the insulating trench followed by an annealing process. In an exemplary embodiment, the step of filling the insulating trench with the distributed nano-nodules further includes a step of depositing semiconductor nano-crystals with oxide shells by applying an aerosol process. In an exemplary embodiment, the step of filling the insulating trench with the distributed nano-nodules further includes steps of depositing a conductive material into the insulating trench followed by inducing a nucleation on the conductive material. In an exemplary embodiment, the step of filling the insulating trench with the distributed nano-nodules further includes steps of depositing a semiconductor material into the insulating trench followed by inducing a nucleation on the semiconductor material to produce grains in the semiconductor material as the nano-nodules. In an exemplary embodiment, the step of filling the insulating trench with the distributed nano-nodules further includes steps of depositing a silicon into the insulating trench followed by inducing a nucleation on the silicon to produce grains in the silicon as the nano-nodules. In an exemplary embodiment, the step of filling the insulating trench with the distributed nano-nodules further includes steps of depositing a polysilicon into the insulating trench followed by steps of doping and annealing of the polysilicon in the insulating trench for inducing to produce grains in the polysilicon as the nano-nodules. In an exemplary embodiment, the step of filling the insulating trench with the distributed nano-nodules further includes a step of filling the insulating trench with embedded semiconductor nodules. In an exemplary embodiment, the step of filling the insulating trench with the distributed nano-nodules further includes steps of filling the insulating trench with a dielectric material followed by applying an annealing process to the dielectric material filling in the insulating trench. In an exemplary embodiment, the step of filling the insulating trench with the distributed nano-nodules further includes steps of depositing seed layers in the insulating trench followed by applying a grain formation process to form the nano-nodules in the insulating trench. In an exemplary embodiment, the step of filling the insulating trench with the distributed nano-nodules further includes steps of depositing silicon in the insulating trench followed by applying a grain formation oxidation process to form separated grains as the nano-nodules in the insulating trench. In an exemplary embodiment, the step of filling the insulating trench with the distributed nano-nodules further includes steps of depositing a polysilicon in the insulating trench followed by applying a nucleating process to form separated silicon grains as the nano-nodules in the insulating trench. In an exemplary embodiment, the step of filling the insulating trench with the distributed nano-nodules further includes a step of filling the insulating trench with aerosol silicon nano-crystals as the nano-nodules in the insulating trench. In an exemplary embodiment, the step of filling the insulating trench with the distributed nano-nodules further includes steps of applying a chemical vapor deposition (CVD) process with alternating gas types and ration to deposit multiple layer structure of SiOx/SiO2/SiOx/SiO2 with insulating between the SiOx layers followed by an annealing process to form silicon nano-crystals as the nano-nodules in the insulating trench.

The semiconductor devices and manufacturing processes as disclosed above provide a device with improved three-dimensional charge balance to increase the device BV. The nano-crystals, grains, or nodules as nano charge-islands are uniformly distributed to provide charge coupling along the depth of the trenches. Furthermore, the nano charge-islands are implemented in this invention as insulator (dielectric) or insulating particles to reduce the leakage with embedded and distributed charge storage capabilities. In contrast to what has been considered in the past by using the SiPOS that is a semiconductor modified to increase the resistivity to minimize leakage, in this invention, an insulator (dielectric) is employed to reduce leakage and the insulator or dielectric layer is embedded with distributed charge storage capabilities in the Nano-Charge sites. The semiconductor device of this invention thus includes a top and a bottom region with an intermediate region provides a controllable electric conducting channel wherein the intermediate region is provided with a capacitive property by forming insulation trenches embedded with nano-charged sites to establish the capacitive property through the intermediate region.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. A method for manufacturing a semiconductor device comprising:

forming an insulation trench extending from a top region through an intermediate region toward a bottom region to provide a controllable current path traversing through said intermediate region;

filling said insulating trench with randomly and substantially uniformly distributed nano-nodules as charge-islands for electrically coupling with said intermediate region for continuously and uniformly distributing a voltage drop through said currant path; and said step of filling said insulating trench with said distributed nano-nodules further comprising steps of depositing and a Ge rich oxide and annealing said Ge rich oxide to precipitate nano-particles.

2. A method for manufacturing a semiconductor device comprising:

forming an insulation trench extending from a top region through art intermediate region toward a bottom region to provide a controllable current path traversing through said intermediate region;

filling said insulating trench with randomly and substantially uniformly distributed nano-nodules as charge-islands for electrically coupling with said intermediate region for continuously and uniformly distributing a voltage drop through said current path; and said step of filling said insulating trench with said distributed nano-nodules further comprising steps of depositing silicon in said insulating trench followed by applying a grain formation oxidation process to form separated grains as said nano-nodules in said insulating trench.

3. A method for manufacturing a semiconductor device comprising:

forming an insulation trench extending from a top region through an intermediate region toward a bottom region to provide a controllable current path traversing through said intermediate region;

filling said insulating trench with randomly and substantially uniformly distributed nano-nodules as charge-islands for electrically coupling with said intermediate region for continuously and uniformly distributing a voltage drop through said current path; and said step of filling said insulating trench with said distributed nano-nodules further comprising steps of applying a chemical vapor deposition (CVD) process with alternating gas types and ratio and deposit multiple layer structure of SiOx/SiO2/SiOx/SiO2 with insulating between said SiOx layers followed by an annealing process to form silicon nano-crystals as said nano-nodules in said insulating trench.

* * * * *